US012751028B2

(12) United States Patent
Chen et al.

(10) Patent No.: US 12,751,028 B2
(45) Date of Patent: Sep. 29, 2026

(54) LASER RECOVERY OF A CORE LAYER OF A TEMPORARY CARRIER STRUCTURE

(71) Applicant: Taiwan Semiconductor Manufacturing Company, Ltd., Hsinchu (TW)

(72) Inventors: Chi-Ming Chen, Zhubei City (TW); Chia-Shiung Tsai, Hsin-Chu (TW); Eugene Chen, Taipei City (TW); Chung-Yuan Li, Taichung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 628 days.

(21) Appl. No.: 18/194,199

(22) Filed: Mar. 31, 2023

(65) Prior Publication Data

US 2024/0332396 A1 Oct. 3, 2024

(51) Int. Cl.

*H10D 30/01* (2025.01)
*B32B 43/00* (2006.01)
*H10P 90/00* (2026.01)

(52) U.S. Cl.

CPC ......... *H10D 30/015* (2025.01); *B32B 43/006* (2013.01); *H10P 90/1916* (2026.01)

(58) Field of Classification Search

CPC ........ H10D 30/015; H01L 2224/83896; H01L 21/6835; H01L 21/6836; H01L 21/683; H01L 2221/68318; B32B 43/006; B32B 2310/0843

See application file for complete search history.

(56) References Cited

U.S. PATENT DOCUMENTS

| | | | | |
|---|---|---|---|---|
| 9,653,642 B1 * | 5/2017 | Raring | ............... | H10H 20/0133 |
| 2014/0038392 A1 * | 2/2014 | Yonehara | .............. | B81C 1/0038 438/463 |
| 2023/0009693 A1 * | 1/2023 | Gao | .................... | H01L 21/7806 |

OTHER PUBLICATIONS

Cuenca, Jerome & Smith, Matthew & Field, Daniel & Massabuau, F. & Mandal, Soumen & Pomeroy, J. & Wallis, D. & Oliver, R. & Thayne, Iain & Kuball, Martin & Williams, Oliver. (2020). Thermal stress modelling of diamond on GaN/III-Nitride membranes. Carbon. 10.1016/j.carbon.2020.11.067. (Year: 2020).*

(Continued)

*Primary Examiner* — Christine S. Kim
*Assistant Examiner* — Emily Farmer
(74) *Attorney, Agent, or Firm* — Harrity & Harrity, LLP

(57) ABSTRACT

Some implementations described herein provide a temporary carrier structure and techniques to form a semiconductor device on the temporary carrier structure. The temporary carrier structure includes a core layer formed from a material having a first bandgap lattice constant. The temporary carrier structure further includes a debonding layer formed from another material having a second bandgap energy constant that is lesser relative to the first bandgap lattice constant. Techniques to form the semiconductor device including a forming substrate layer of the semiconductor device on the temporary carrier structure, where a material of the substrate layer and the material of the core layer have a same approximate coefficient of thermal expansion. The techniques further include providing energy (e.g., electromagnetic waves from a laser source) to the debonding layer to remove the core layer from the temporary carrier structure.

20 Claims, 20 Drawing Sheets

(56) References Cited

OTHER PUBLICATIONS

DC characterization of laser-debonded GaN HEMTs C. P. Chan, K. K. Leung, M. Pilkuhn, C. Surya, T. M. Yue, G. Pang, H. Schweizer (Year: 2007).*
Chi, Zeyu & Asher, Jacob & Jennings, Michael & Chikoidze, Ekaterine & Perez-Tomas, Amador. (2022). Ga2O3 and Related Ultra-Wide Bandgap Power Semiconductor Oxides: New Energy Electronics Solutions for CO2 Emission Mitigation. Materials. 15.10.3390/ma15031164. (Year: 2022).*

* cited by examiner

LASER RECOVERY OF A CORE LAYER OF A TEMPORARY CARRIER STRUCTURE

BACKGROUND

Gallium nitride (GaN)-based materials have several advantages on electrical, mechanical, and chemical properties, such as wide band gap, high breakdown voltage, high electron mobility, large elastic modulus, high piezoelectric and piezoresistive coefficients, etc., as well as chemical inertness. Such advantages make GaN-based materials attractive for making semiconductor devices such as power management devices, high brightness light-emitting diodes (LEDs), and other types of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
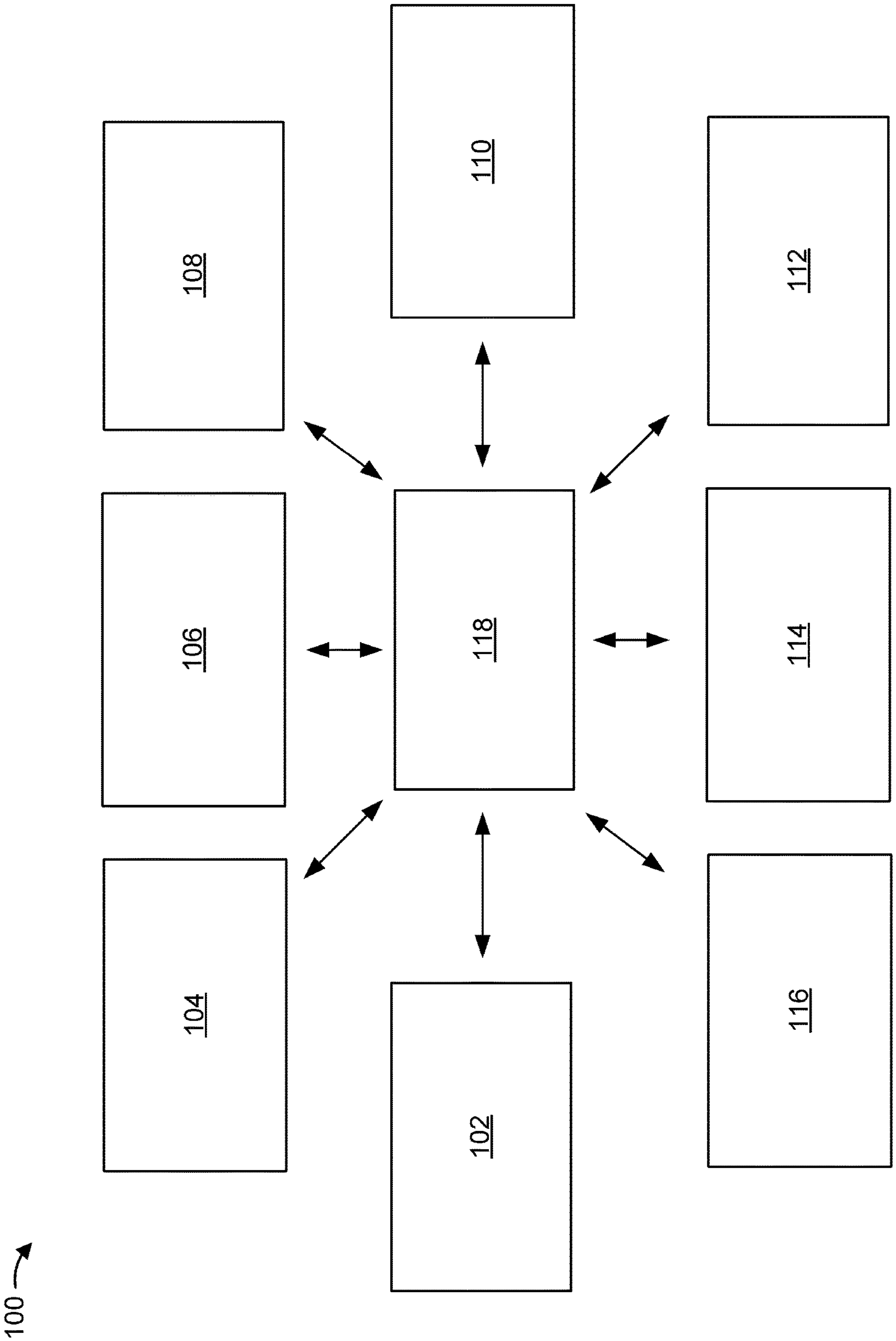
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a semiconductor device (e.g., a power device including transformer integrated circuitry, amplifier integrated circuitry, or voltage regulation integrated circuitry) may have an operating voltage that is included in a range of approximately 600 volts (V) to approximately 1200 V. For performance purposes, the semiconductor device may include a high mobility electron transistor structure formed on a layer of a high bandgap material (e.g., a GaN material).

For handling purposes, techniques to fabricate the semiconductor device may include using a temporary carrier structure having a core layer that includes a silicon (Si) material. However, mismatches in coefficients of thermal expansion (CTEs) between the GaN material and the Si material within a temperature range at which the GaN material is epitaxially grown (e.g., a ratio of the $CTE_{GaN}$ to the $CTE_{Si}$ in the temperature range may be approximately 3:2) may cause manufacturing defects. As an example, and for semiconductor devices manufactured in a form of a wafer having a thickness that is greater than approximately 6 microns and a diameter greater than approximately 150 millimeters, manufacturing defects may include cracking and/or dislocation issues within the silicon material. As another example, and for semiconductor devices manufactured in a form of a wafer having a diameter of greater than approximately 200 millimeters, wafer bow and/or warpage may cause nonuniformities in epitaxial growth of the GaN material.

In some implementations, and to overcome challenges related to using the temporary carrier structure having a core layer including the silicon (Si) material, a temporary carrier structure having a core layer including an aluminum nitride (AlN) material may be used. In such implementations, similar CTEs between the GaN material and the AlN material (e.g., a ratio of the $CTE_{GaN}$ to the $CTE_{AlN}$ may be approximately 1:1 within the temperature range at which GaN is epitaxially grown) may reduce a likelihood of such defects.

Processes for removing the core layer (e.g., near or upon completion of the semiconductor device) may damage the core layer beyond reuse. For example, removing the core layer may include using an etching process that damages and/or dissolves the core layer. In a case where the core layer includes the AlN material, damaging the core layer beyond reuse may add substantial manufacturing costs. Furthermore, the processes for removing the core layer may damage the semiconductor device.

Some implementations described herein provide a temporary carrier structure and techniques to form a semiconductor device on the temporary carrier structure. The temporary carrier structure includes a core layer formed from a material having a first bandgap lattice constant. The temporary carrier structure further includes a debonding layer formed from another material having a second bandgap energy constant that is lesser relative to the first bandgap lattice constant. Techniques to form the semiconductor device include forming substrate layer of the semiconductor device on the temporary carrier structure, where a material of the substrate layer and the material of the core layer have a same approximate CTE. The techniques further include providing energy (e.g., electromagnetic waves from a laser source) to the debonding layer to remove the core layer from the temporary carrier structure.

Due to the difference in bandgap lattice constants between the material of the core layer and the material of the debonding layer, the energy may be of a wavelength that penetrates the core layer and is absorbed by the debonding layer. Such a wavelength may reduce damage to the core layer and/or the substrate layer to reduce manufacturing costs (e.g., the core layer may be recovered for reuse and a yield of a semiconductor device formed on the substrate layer may increase).

Further, and due to the same approximate CTE of the material of the core layer and the material of the substrate layer, manufacturing defects in the semiconductor device due to thermal strains and/or stresses during formation of the semiconductor device may be minimized. For example, and for semiconductor devices manufactured in a form of a wafer having a thickness that is greater than approximately 6 microns and a diameter greater than approximately 150 millimeters, manufacturing defects such as cracking and/or dislocation issues within the silicon material may be minimized. As another example, and for semiconductor devices manufactured in a form of a wafer having a diameter of greater than approximately 200 millimeters, manufacturing defects such as wafer bow and/or warpage that cause non-uniformities in epitaxial growth of the GaN material may be minimized.

In this way, a manufacturing yield of the semiconductor device may increase relative to another semiconductor device fabricated using another temporary carrier structure not including the debonding layer and/or the core layer. Additionally, or alternatively, a recovery rate of the core layer may increase relative to another recovery rate for another core layer from another temporary carrier structure not including the debonding layer. By increasing the manufacturing yield of the semiconductor device and increasing the recovery rate of the core layer, an amount of resources to fabricate a volume of the semiconductor device (manufacturing tools, raw materials, manpower, and/or computing resources, among other examples) may be decreased.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, a laser tool 114, a bonding tool 116, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The laser tool 114 is a semiconductor processing tool that is capable of providing energy to a substrate and/or a semiconductor device. For example, the laser tool 114 may emit electromagnetic radiation (e.g., light) of different wavelengths as part of a heating, cutting, drilling, or lithography operation performed upon substrate and/or the semiconductor device. For a material included as part of substrate and/or the semiconductor device, an amount of energy from the laser source that is absorbed by the material, or that is transmitted through the material, may be dependent on one or more properties of the material (e.g., a lattice structure) and/or a wavelength of the electromagnetic radiation.

The bonding tool 116 is a semiconductor processing tool that is capable of bonding two or more wafers (or two or more semiconductor substrates, or two or more semiconductor devices) together. For example, the bonding tool 116 may include a eutectic bonding tool that is capable of forming a eutectic bond between two or more wafers together. For example, the bonding tool may heat the two or more wafers to form a eutectic system between the materials of the two or more wafers. As another example, the bonding tool 116 may include a hybrid bonding tool, a direct bonding tool, and/or another type of bonding tool. In some implementations, the bonding tool 116 is capable of bonding two or more carrier structures (e.g., two or more temporary carrier structures) together.

The wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

In some implementations, one or more of the semiconductor processing tools 102-116 and/or the wafer/die transport tool 118 may perform a series of semiconductor manufacturing operations described herein. For example, the series of semiconductor manufacturing operations includes joining a first temporary carrier structure and a second temporary carrier structure. The series of semiconductor manufacturing operations includes providing energy from a laser source to a debonding layer that is between a core layer of the first temporary carrier structure and a seed layer held by the first temporary carrier structure. The series of semiconductor manufacturing operations includes removing the core layer from the first temporary carrier structure that is joined with the second temporary carrier structure.

Additionally, or alternatively, the series of semiconductor manufacturing operations performed includes forming a core layer of a temporary carrier structure, where the core layer includes a first bandgap lattice constant. The series of semiconductor manufacturing operations includes forming a debonding layer over the core layer, where the debonding layer includes a second bandgap lattice constant that is lesser relative to the first bandgap lattice constant. The series of semiconductor manufacturing operations includes forming a dielectric layer over the debonding layer. The series of semiconductor manufacturing operations includes joining the dielectric layer and a layer stack that includes a seed layer. The series of semiconductor manufacturing operations includes providing energy from a laser source to the debonding layer to separate the core layer from the temporary carrier structure, where the temporary carrier structure includes the seed layer.

Additionally, or alternatively, the series of semiconductor manufacturing operations includes forming a core layer of a temporary carrier structure from a first material, where the first material includes a first coefficient of thermal expansion. The series of semiconductor manufacturing operations includes forming a debonding layer over the core layer. The method includes forming a dielectric layer over the debonding layer. The series of semiconductor manufacturing operations includes forming a substrate layer, from a second material that is different than the first material, onto a seed layer that is joined to the dielectric layer, where the second material includes a second coefficient of thermal expansion that is approximately equal to the first coefficient of thermal expansion. The series of semiconductor manufacturing operations includes providing energy from a laser source to the debonding layer to separate the core layer from the dielectric layer, the seed layer that is joined to the dielectric layer, and the substrate layer that is formed onto the seed layer.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
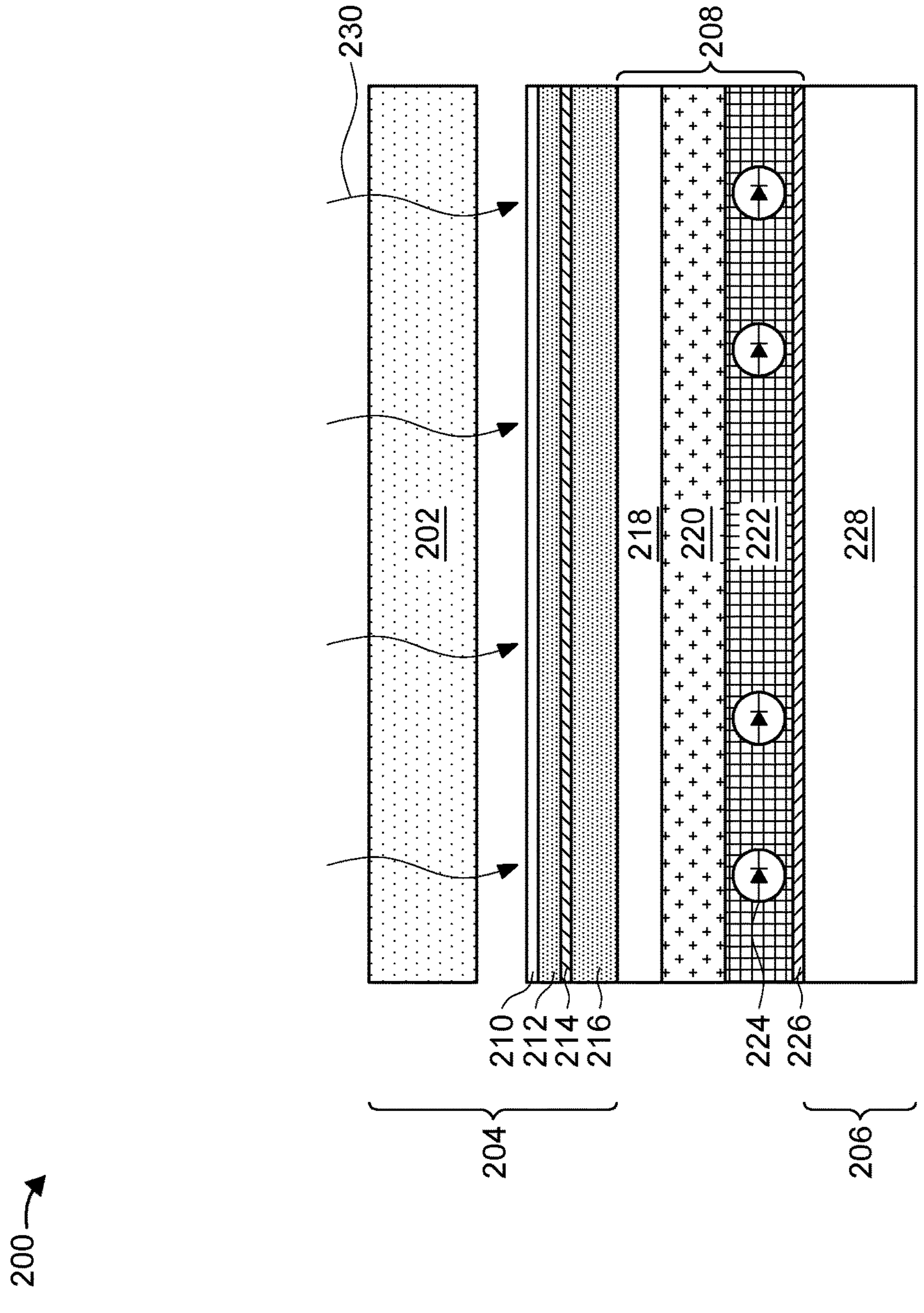
FIG. 2 is a diagram of an example implementation described herein.

FIG. 2 is a diagram of an example implementation 200 described herein. As described in greater detail in connection with FIGS. 3A-3N, and elsewhere herein, a core layer 202 (e.g., aluminum nitride (AlN) material) may be included as part of a temporary carrier structure 204. The temporary carrier structure 204 may be joined with a top surface of a semiconductor device 208 (e.g., a power device or an optoelectronic device) held by the temporary carrier structure 206. Furthermore, the core layer 202 may be recovered from the temporary carrier structure 204 for reuse.

During formation of the semiconductor device 208, the temporary carrier structure 204 may include a debonding layer 210 (e.g., a layer of a polysilicon material, a layer of a silicon carbide (SiC) material, or layer of a gallium nitride (GaN) material). The temporary carrier structure 204 may further include a dielectric layer 212 (e.g., a layer of a silicon dioxide ($SiO_2$) material), a dielectric layer 214 (e.g., a layer of a silicon nitride (SiN) material), and a dielectric layer 216 (e.g., a layer of an $SiO_2$ material).

The semiconductor device 208 is formed on the temporary carrier structure 204. For example, the semiconductor device 208 may include a seed layer 218 (e.g., a layer of a p(−) type of silicon material) and a substrate layer 220 including a high bandgap material. The high bandgap material may include a GaN material. Additionally, or alternatively, the high bandgap material may include a bandgap lattice constant that is included in a range of approximately 3.25 electron volts (eV) to approximately 3.75 cV. If the bandgap lattice constant is less than approximately 3.25 electron volts, the high bandgap material included in the substrate layer 220 may be incompatible with performance requirements of the semiconductor device 208. If the bandgap lattice constant is greater than approximately 3.75 electron volts, the high bandgap material may have a CTE that is mismatched with a material of the core layer 202 and cause defects to the semiconductor device 208 during manufacturing. However, other values and ranges for the bandgap lattice constant for the high band gap material are within the scope of the present disclosure.

The semiconductor device 208 may further include a high electron mobility transistor (HEMT) layer 222 that includes integrated circuitry 224 (active devices, passive devices, interconnect structure, transformer integrated circuitry, amplifier integrated circuitry, voltage regulation integrated circuitry, LED integrated circuitry, and/or photosensor integrated circuitry, among other examples).

Formation of the substrate layer 220, and or one or more portions of the HEMT layer 222 including the integrated circuitry 224, may include one or more high temperature operations. For example, formation of the substrate layer 220 and one or more portions of the HEMT layer 222 may include a high temperature CVD operation that is performed at a temperature that is within a range of approximately 600 degrees Celsius (C) to approximately 800° C. In such a case, stresses and/or strains within (and damage to) the temporary carrier structure 204 (and/or layers of the semiconductor device 208) may be reduced by matching materials of the substrate layer 220 and the core layer 202 to include a similar coefficient of thermal expansion (CTE).

For example, the substrate layer 220 may include a GaN material having a CTE of approximately 6 microns per meter. Kelvin (μm/m·K) for the temperature within the range of approximately 600 degrees Celsius (° C.) to approximately 800° C. In such a case, a material of the core layer 202 may be selected to include a metal compound including an aluminum nitride (AlN) material and having an approximately same CTE (e.g., an AlN material having a CTE of approximately 6 μm/m·K for the temperature within the range of approximately 600 degrees ° C. to approximately 800° C.)

As shown in FIG. 2, a protective layer 226 (e.g., a layer of a polyimide material) of the semiconductor device 208 is between the HEMT layer 222 and the core layer 228. In some implementations, additional manufacturing operations may include transferring the seed layer 218, the substrate layer 220, and the HEMT layer 222 that includes the integrated circuitry 224 onto the temporary carrier structure 206. In such implementations, the core layer 202 may be removed from the temporary carrier structure 204 and recovered for reuse.

A laser source may provide energy 230 to the debonding layer 210 to remove the core layer 202 from the temporary carrier structure 204. In such a case, damage to core layer 202 may be avoided by the laser source providing an electromagnetic wave that is "transparent" to a material of the core layer 202. For example, the core layer 202 may include an AlN material including a bandgap lattice constant of approximately 6.28 electron volts.

To avoid damaging the core layer 202, and based on such a bandgap lattice constant, the laser source may provide an electromagnetic wave having a wavelength that is included in a range of approximately 180 nanometers to approximately 260 nanometers. If the wavelength is less than approximately 180 nanometers, or greater than approximately 260 nanometers, the electromagnetic wave (e.g., the energy 230) may not pass through the core layer 202 to the debonding layer 210 without damaging the core layer 202. Additionally, or alternatively, the if the wavelength is less than approximately 180 nanometers, or greater than approximately 260 nanometers, the electromagnetic wave (e.g., the energy 230) may not be absorbed by the debonding layer 210 sufficiently to remove the core layer 202.

Additionally, or alternatively, the laser source may provide an electromagnetic wave having a wavelength that is included in a range of approximately 210 nanometers to approximately 380 nanometers. However, other values and ranges for the wavelength of the electromagnetic wave are within the scope of the present disclosure.

The debonding layer 210 may further include a material having a bandgap lattice constant that is lesser relative to the bandgap lattice constant of the core layer 202. For example, the debonding layer 210 may include a material having a bandgap lattice constant that is included in a range of approximately 1.0 eV to approximately 4.0 cV. Additionally, or alternatively, the debonding layer 210 may include a material having a bandgap lattice constant that is included in a range of approximately 1.0 eV to approximately 3.6 cV. Additionally, or alternatively, the debonding layer 210 may include a material having a bandgap lattice constant that is included in a range of approximately 1.12 eV to approximately 6.28 eV. Having such a bandgap lattice constant, in combination with the wavelength of the electromagnetic wave passing through the core layer 202, enables the debonding layer 210 to absorb the energy 230 to decouple and remove the core layer 202 from the temporary carrier structure 204. Furthermore, and as a result of the debonding layer 210 absorbing the energy 230 during removal of the core layer 202, a likelihood of damage to the semiconductor device 208 may be reduced.

If the bandgap lattice constant is less than approximately 1 eV, or greater than approximately 4 eV, the material may not sufficiently absorb energy (e.g., the energy 230) from electromagnetic waves that pass through an AlN core layer. However, other values and ranges for the bandgap lattice constant of a material included in the debonding layer 210 are within the scope of the present disclosure.

Through use of the debonding layer 210 and/or the core layer 202, a manufacturing yield of the semiconductor device 208 may increase relative to another semiconductor device fabricated using another temporary carrier structure not including the debonding layer 210 and/or the core layer 202. Additionally, or alternatively, a recovery rate of the core layer 202 may increase relative to another recovery rate for another core layer from another temporary carrier structure not including the debonding layer 210. By increasing the manufacturing yield of the semiconductor device 208 and increasing the recovery rate of the core layer 202, an amount of resources to fabricate a volume of the semiconductor device 208 (manufacturing tools, raw materials, manpower, and/or computing resources, among other examples) may be decreased.

The number and arrangement layers and/or components shown in FIG. 2 are provided as one or more examples. In practice, there may be additional layers and/or components, fewer layers and/or components, different layers and/or components, or differently arranged layers and/or components than those shown in FIG. 2.

Figure 3A:
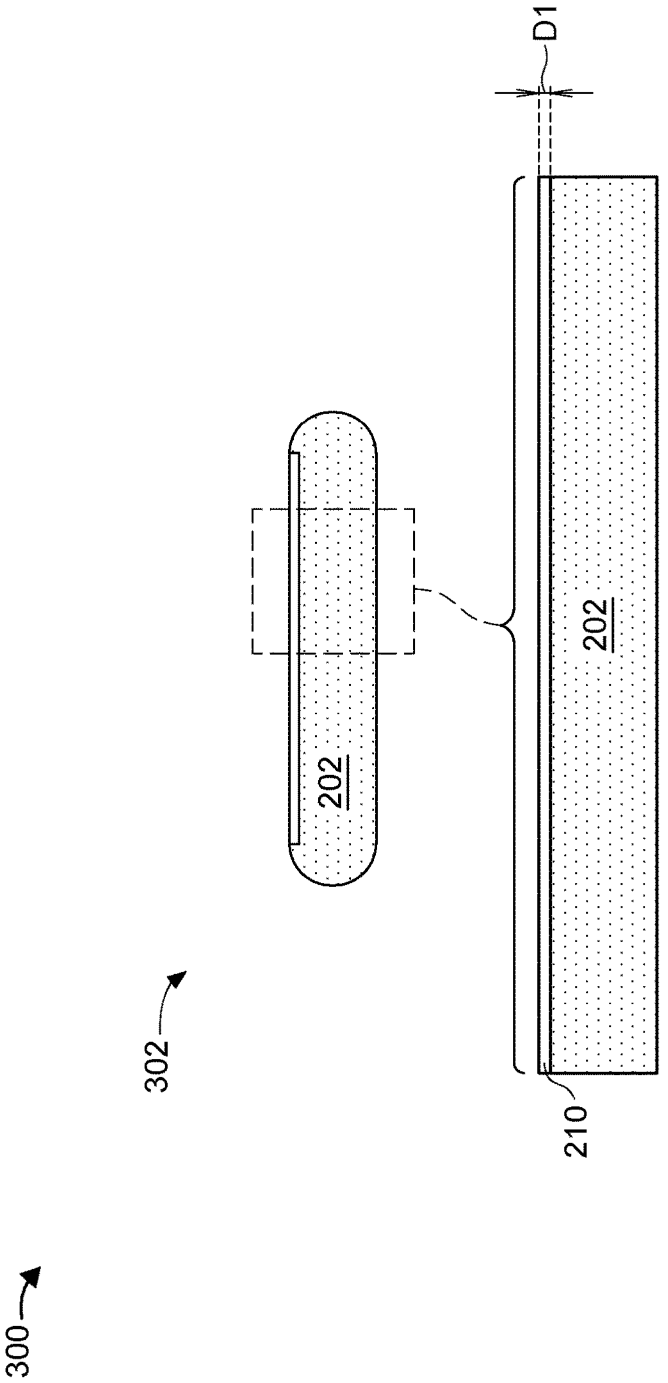
FIGS. 3A-3N are diagrams of an example series of operations using a core layer and a debonding layer described herein.
Figure 3B:
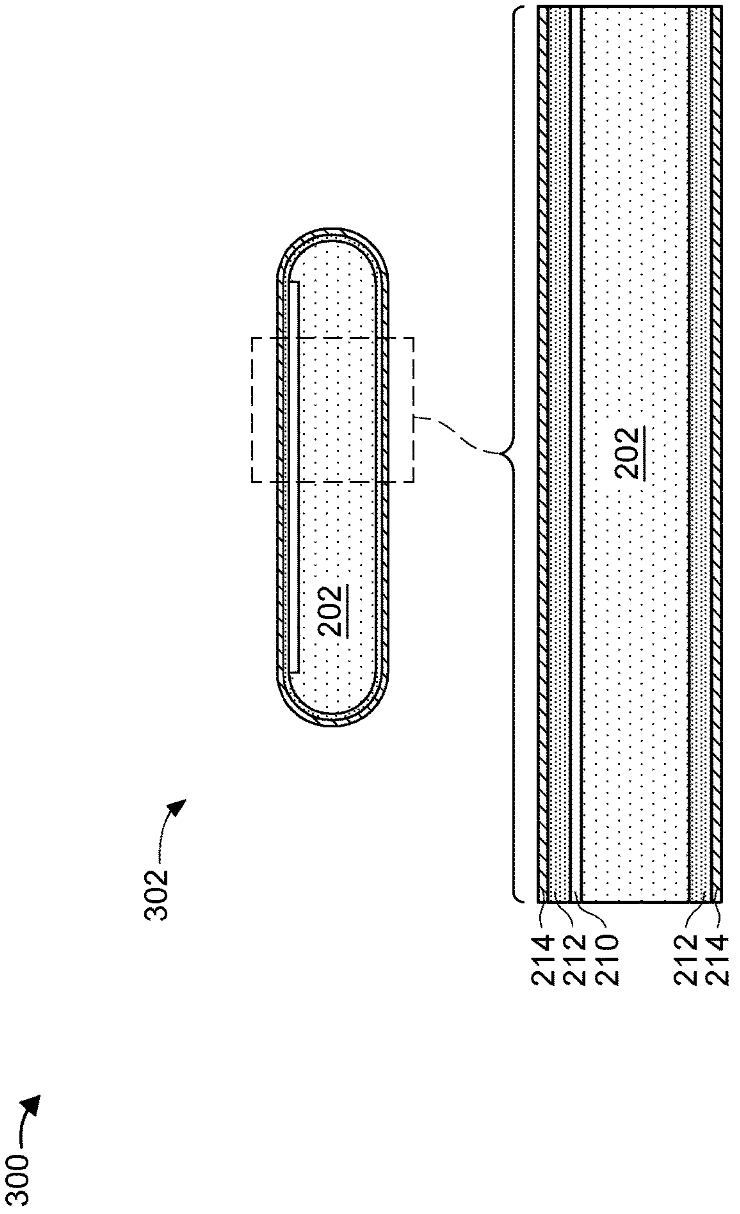
Figure 3C:
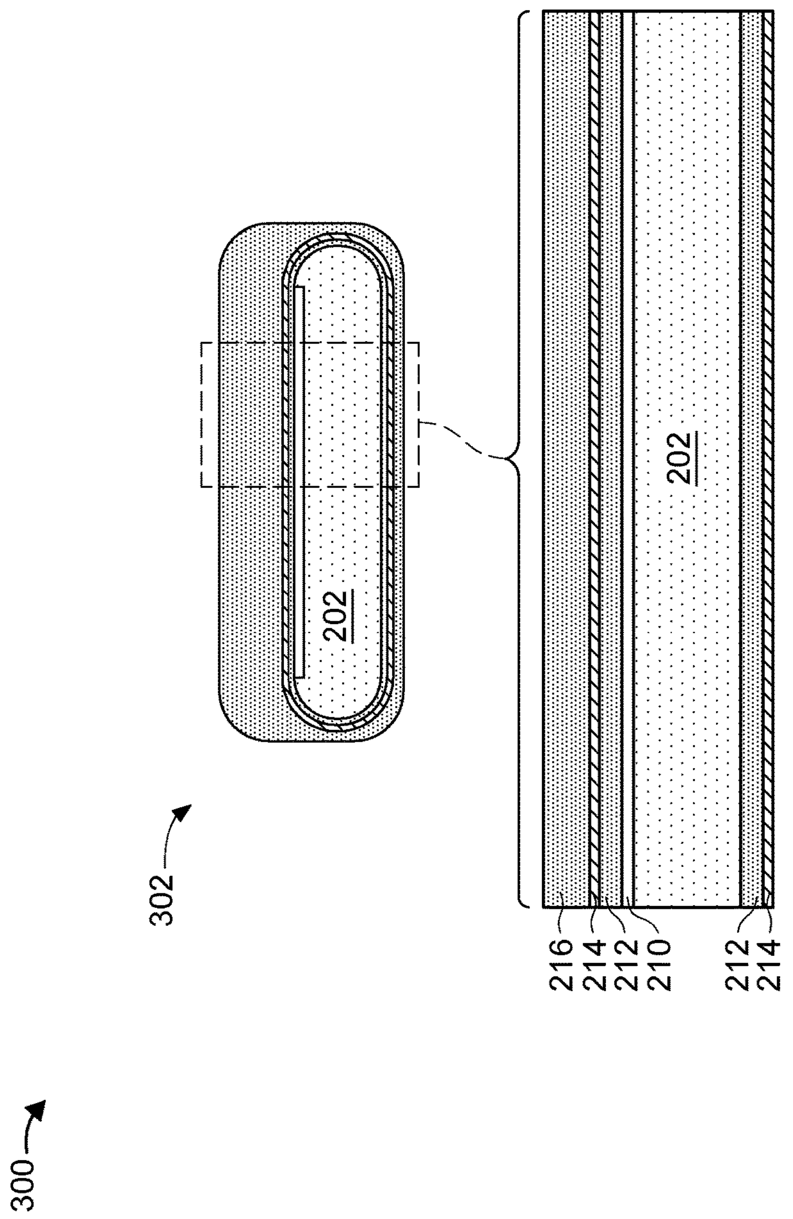
Figure 3D:
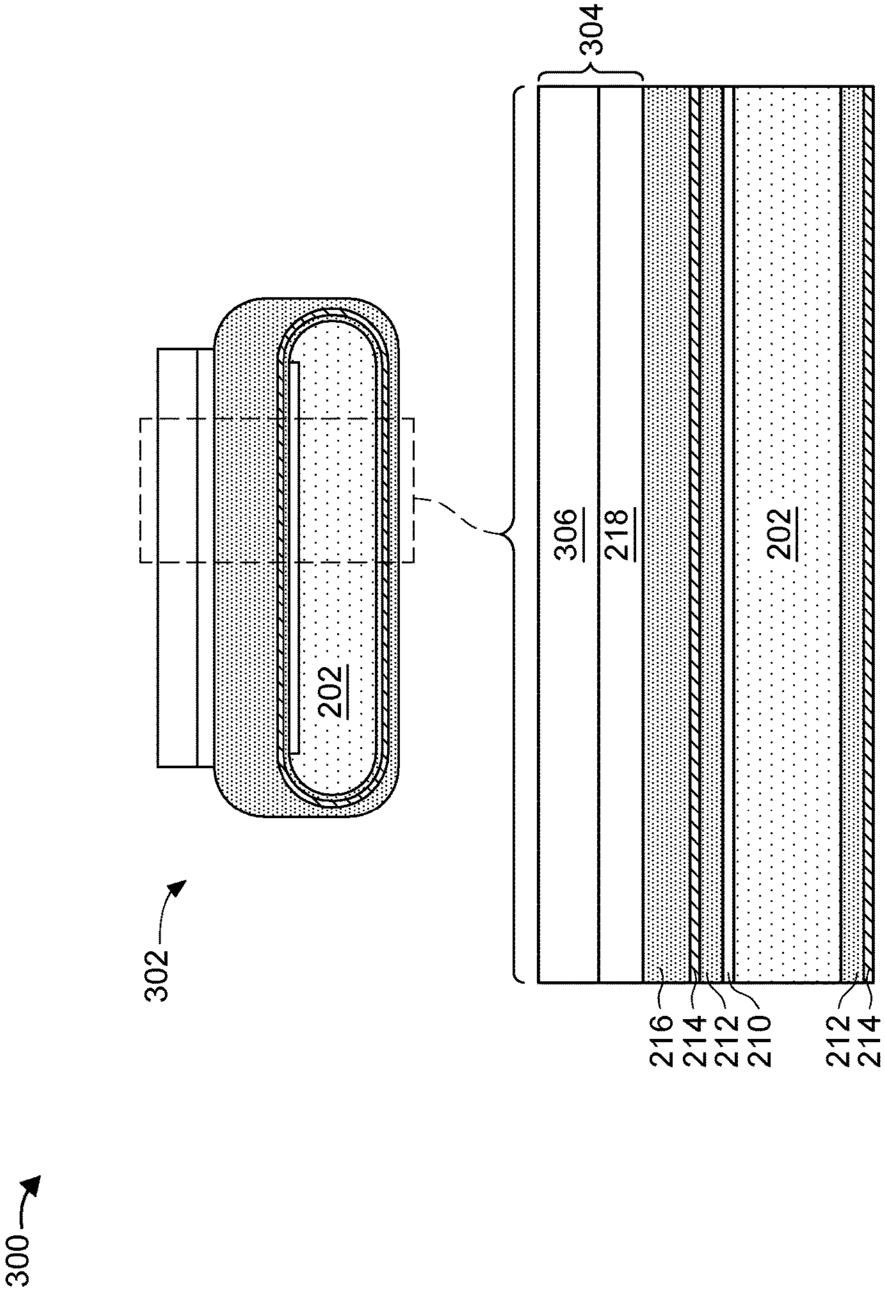
Figure 3E:
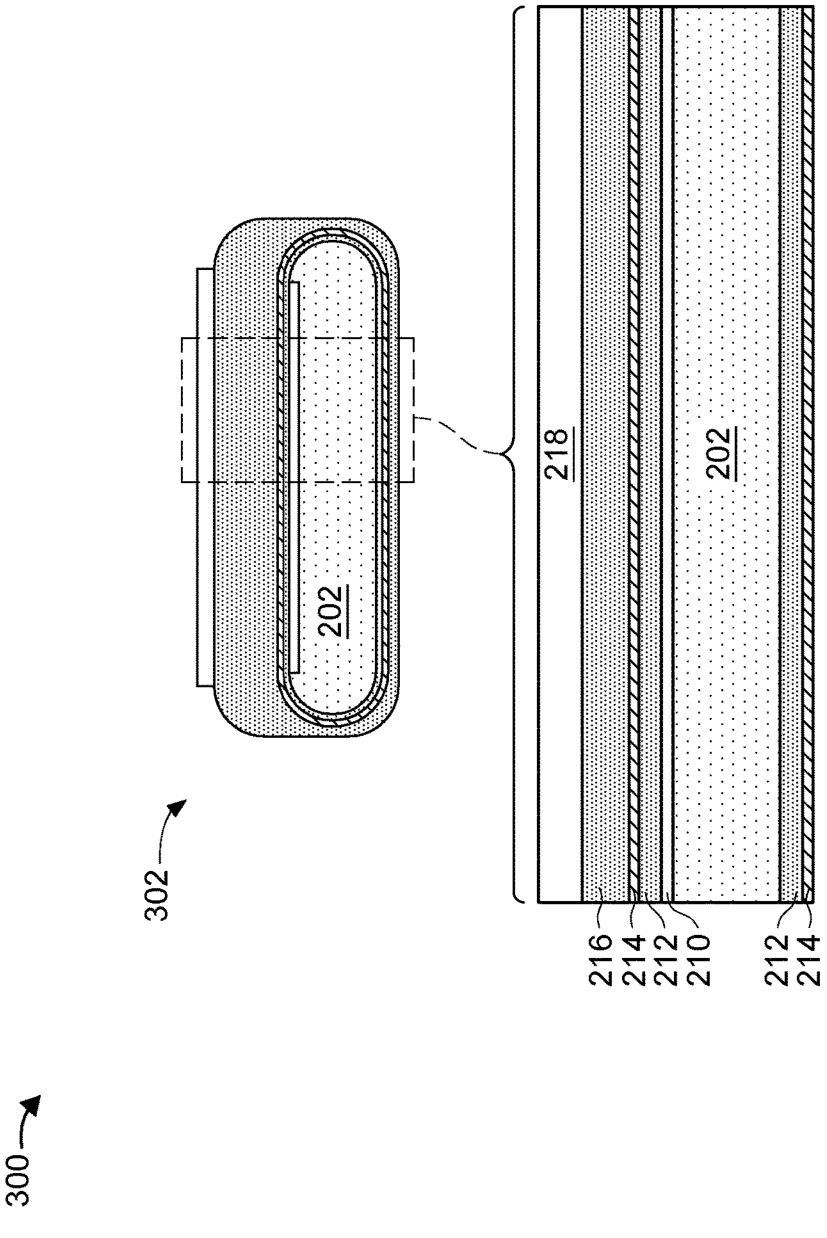
Figure 3F:
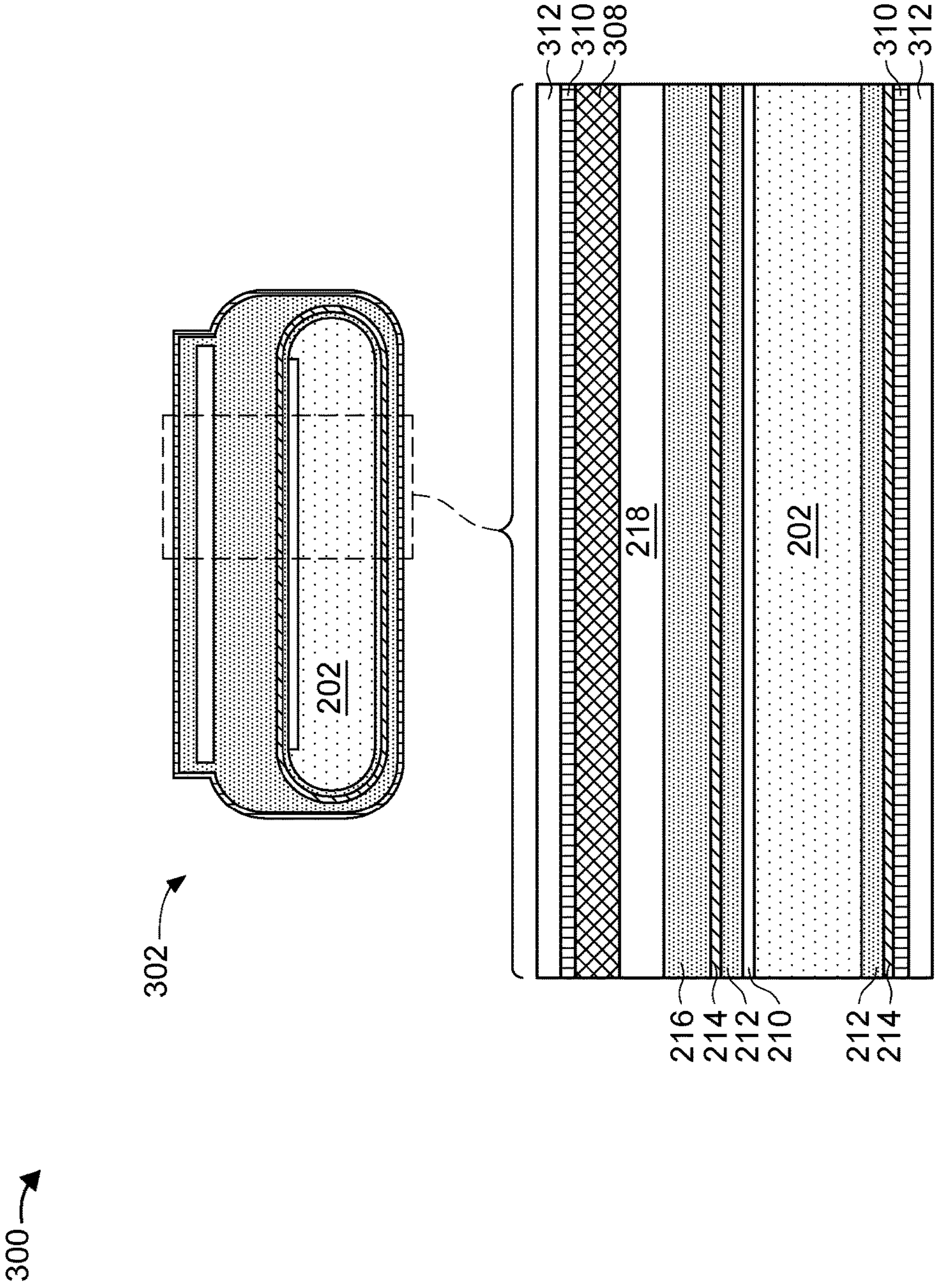
Figure 3G:
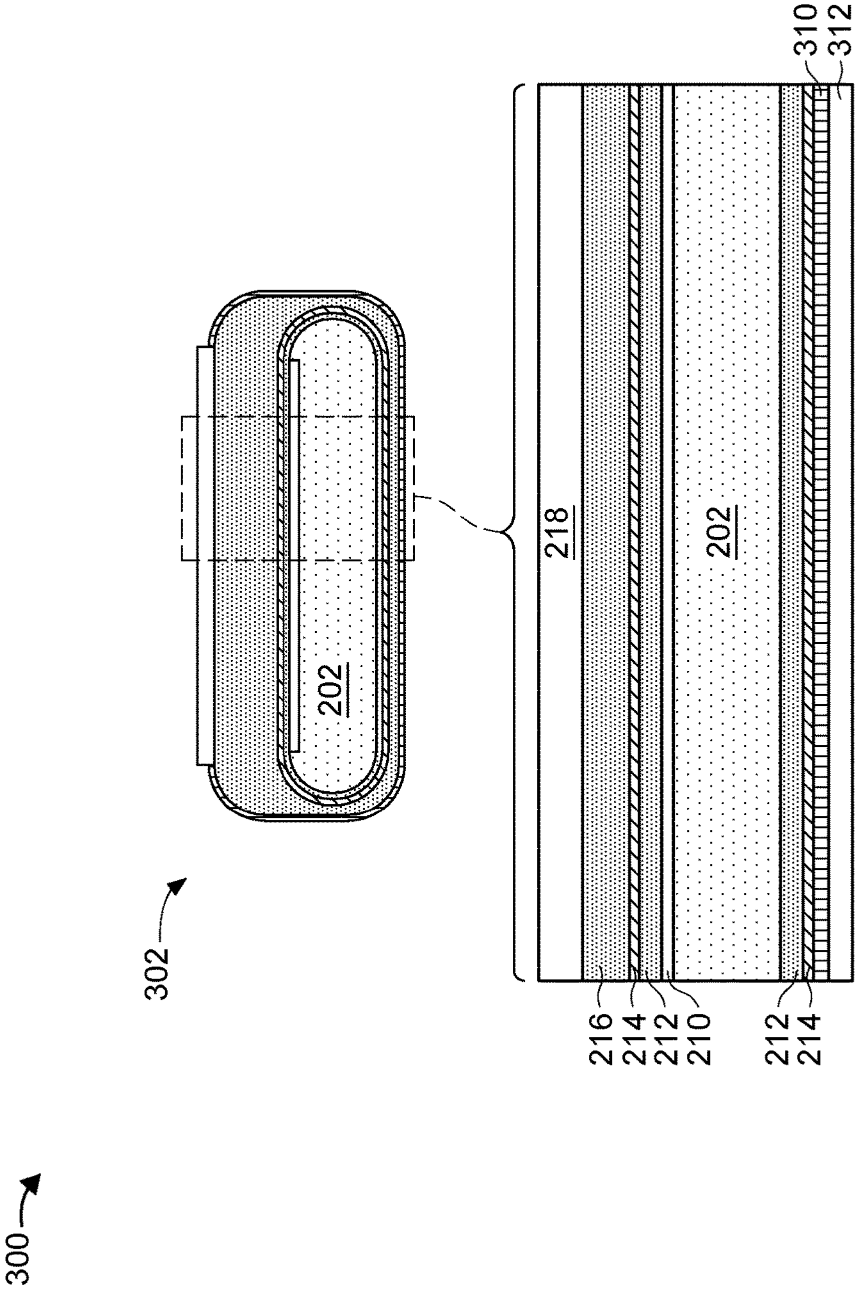
Figure 3H:
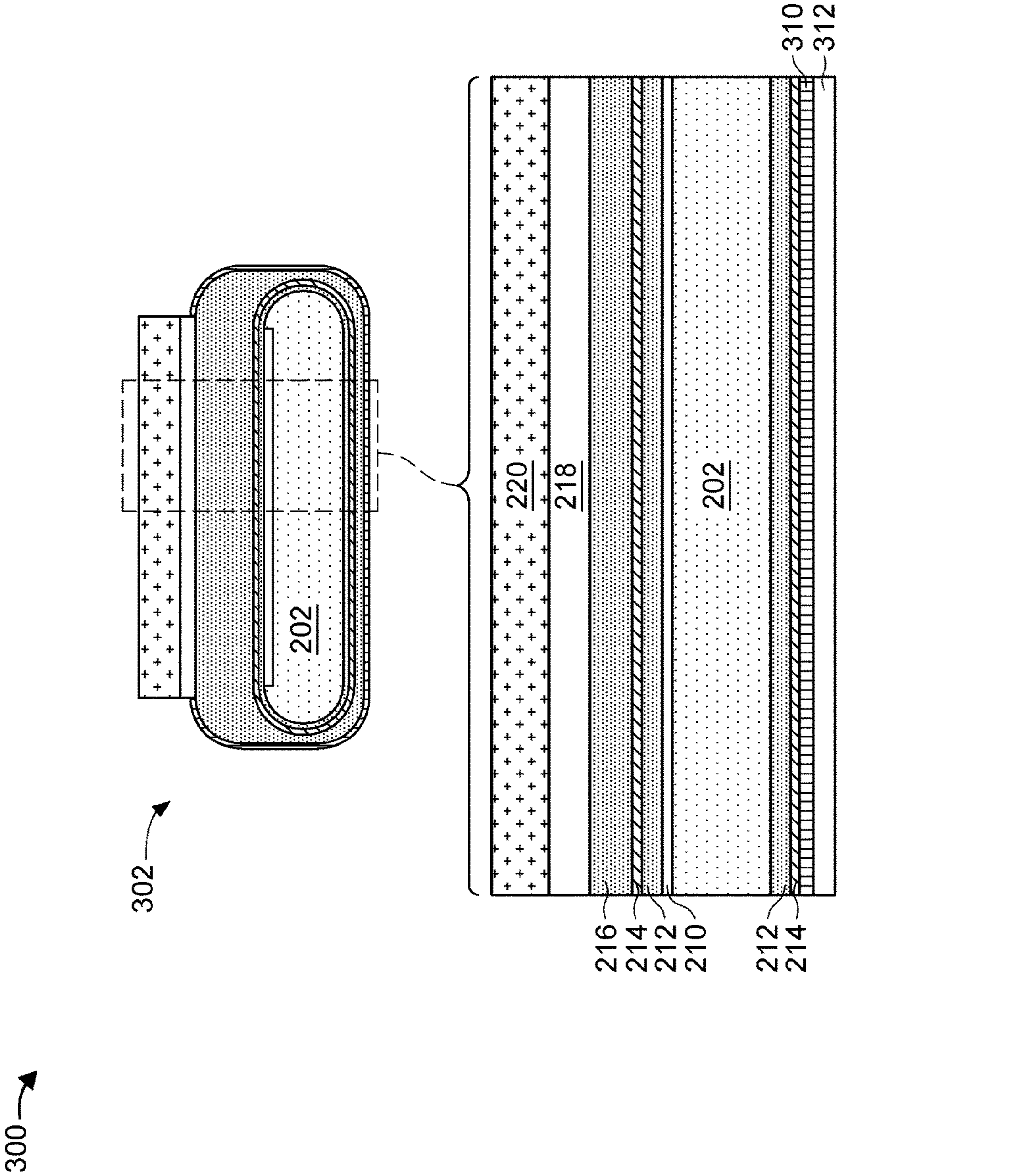
Figure 3I:
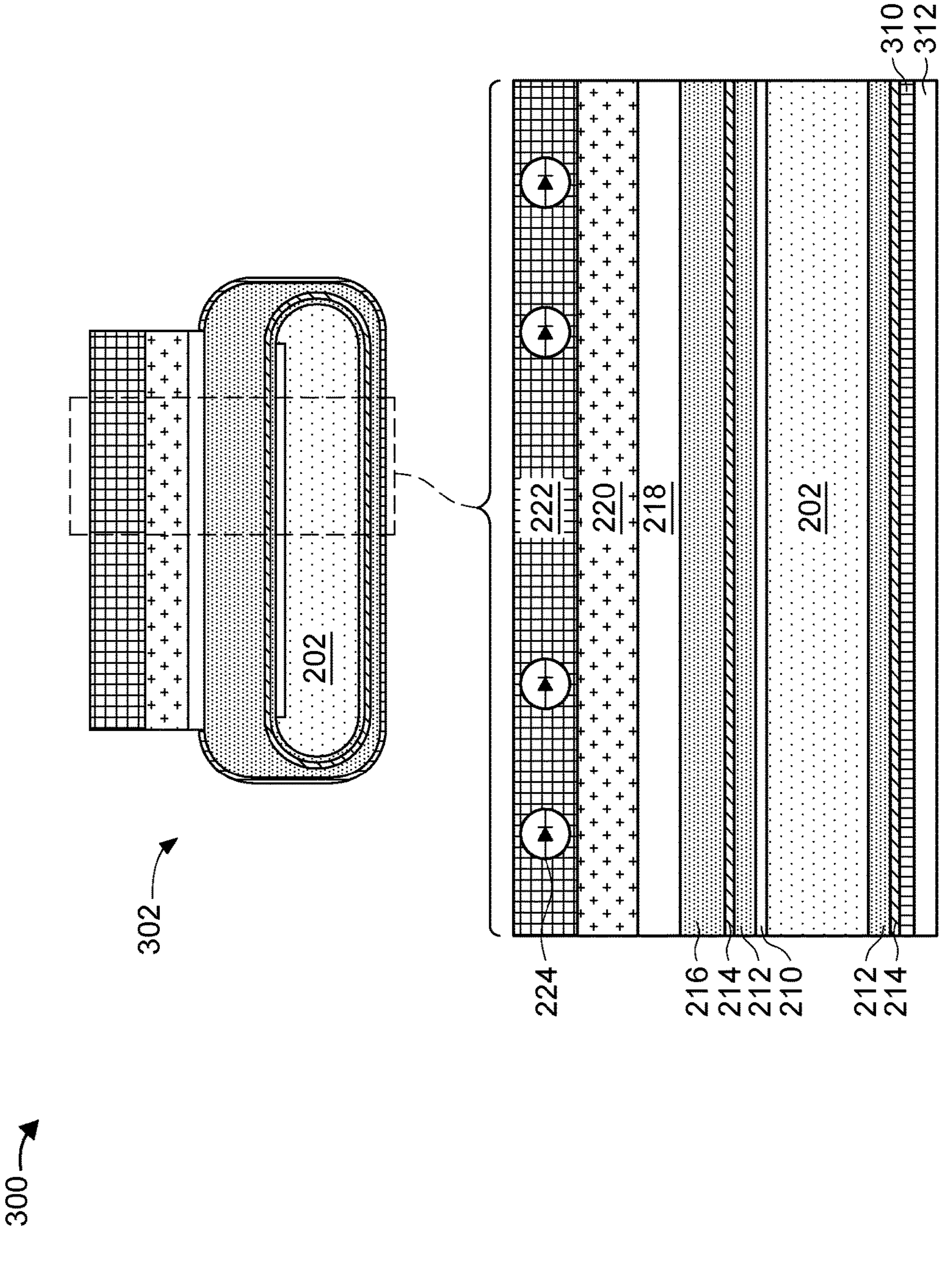
Figure 3J:
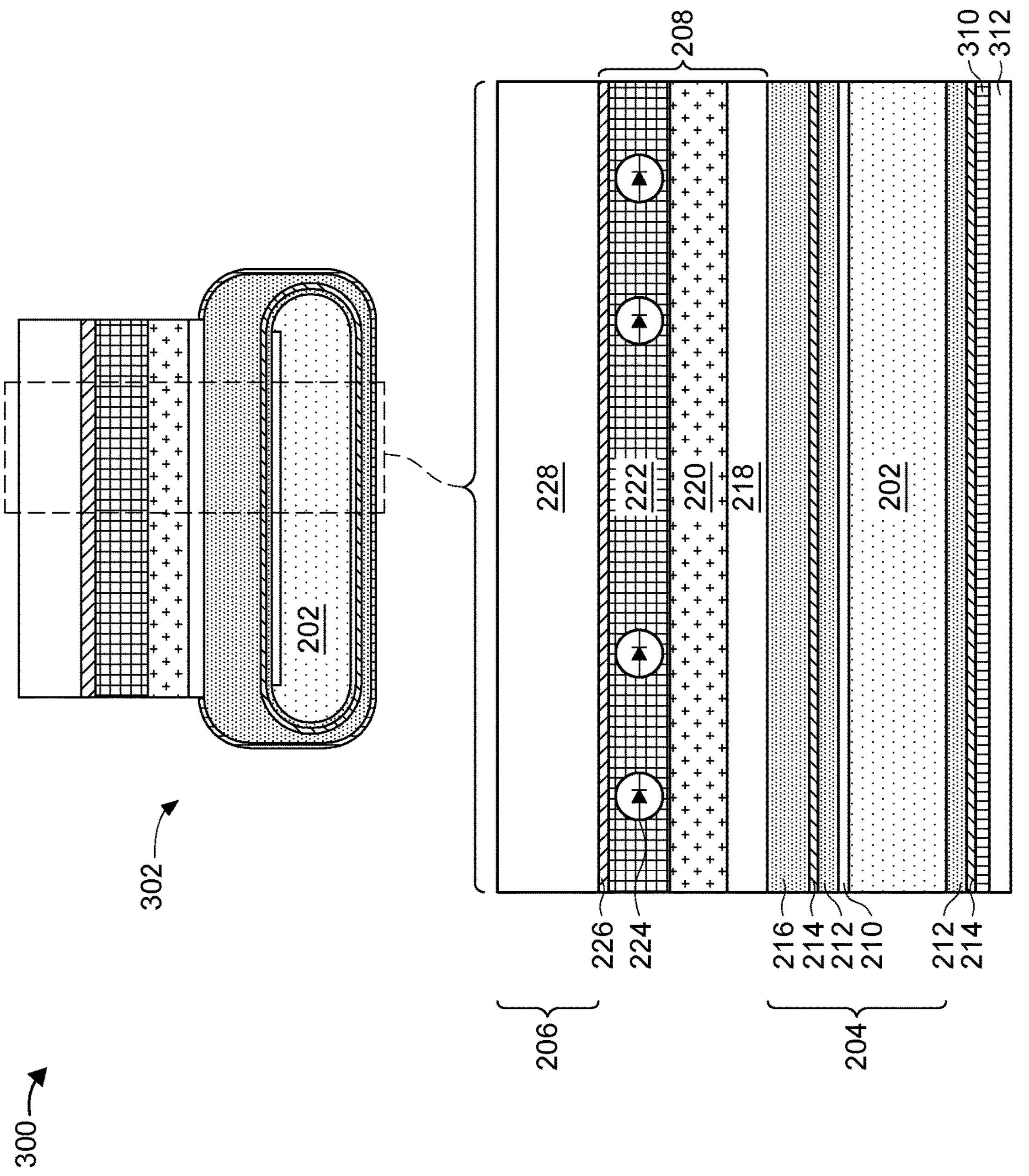
Figure 3K:
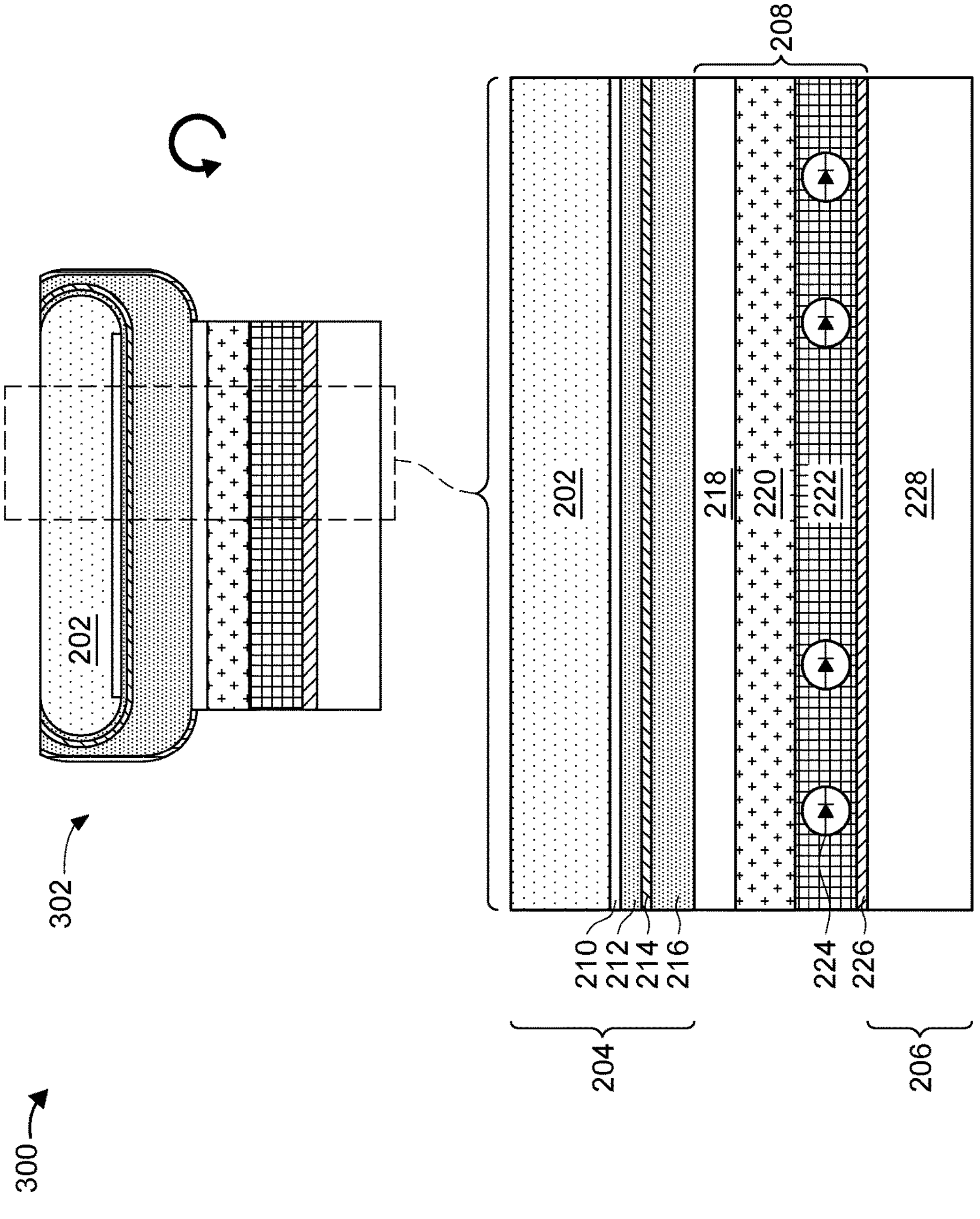
Figure 3L:
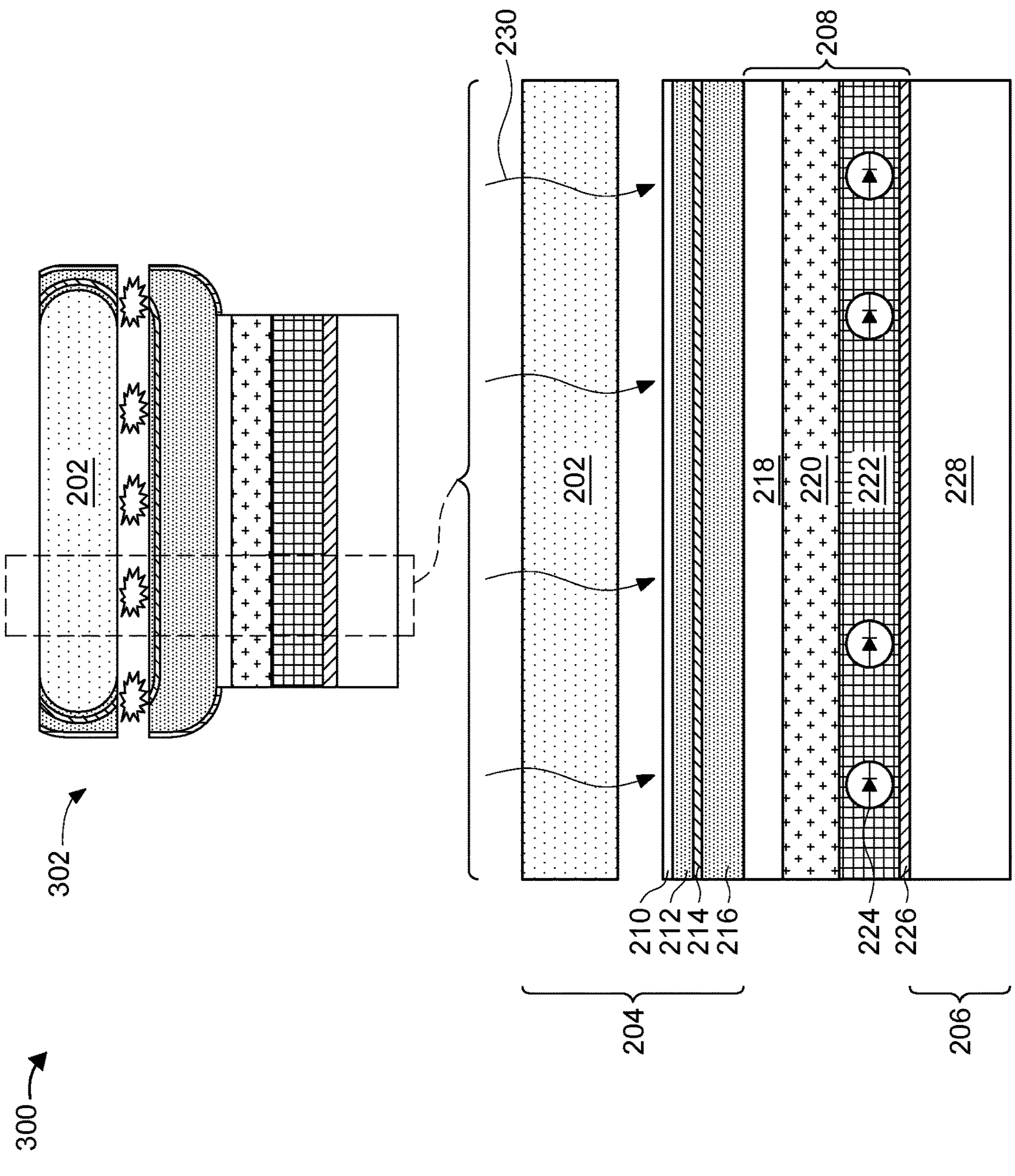
Figure 3M:
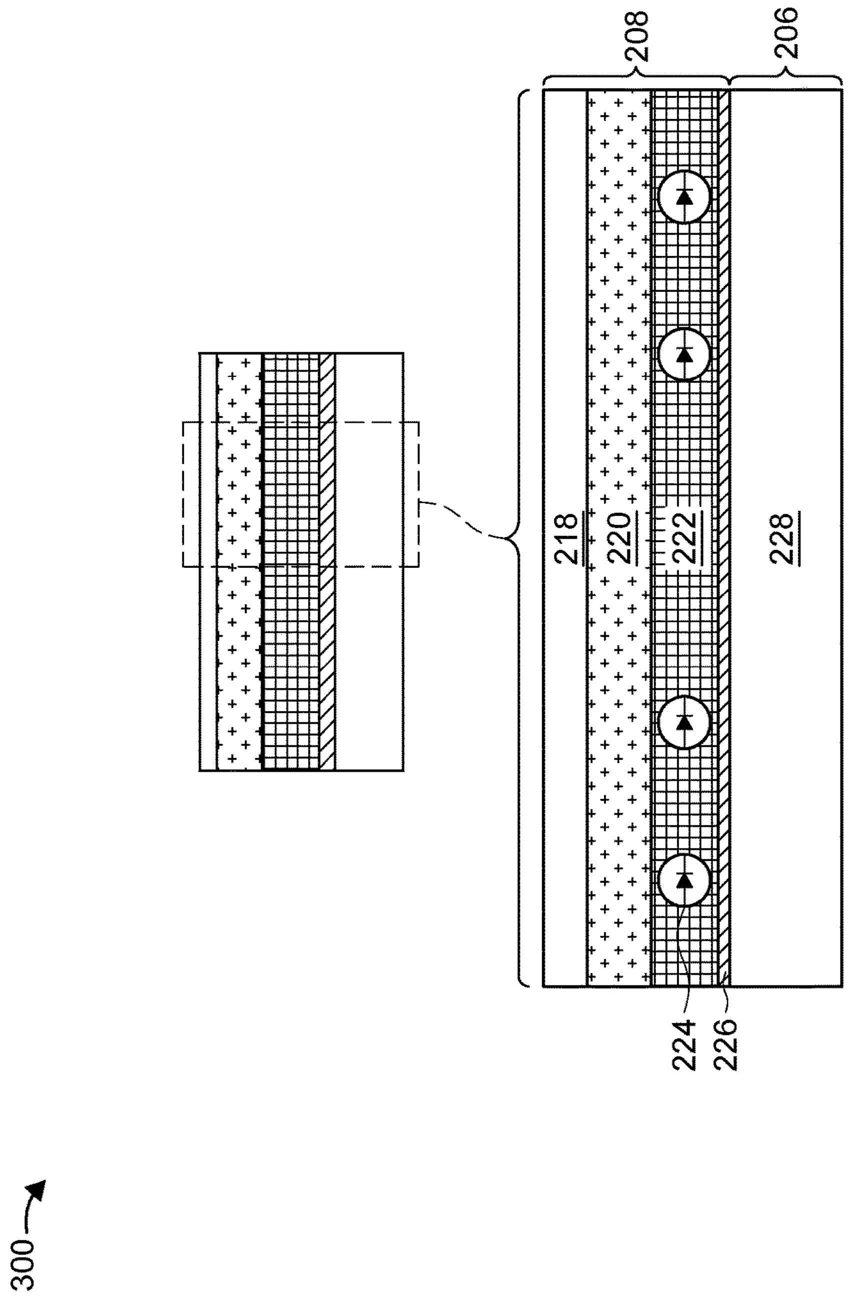
Figure 3N:
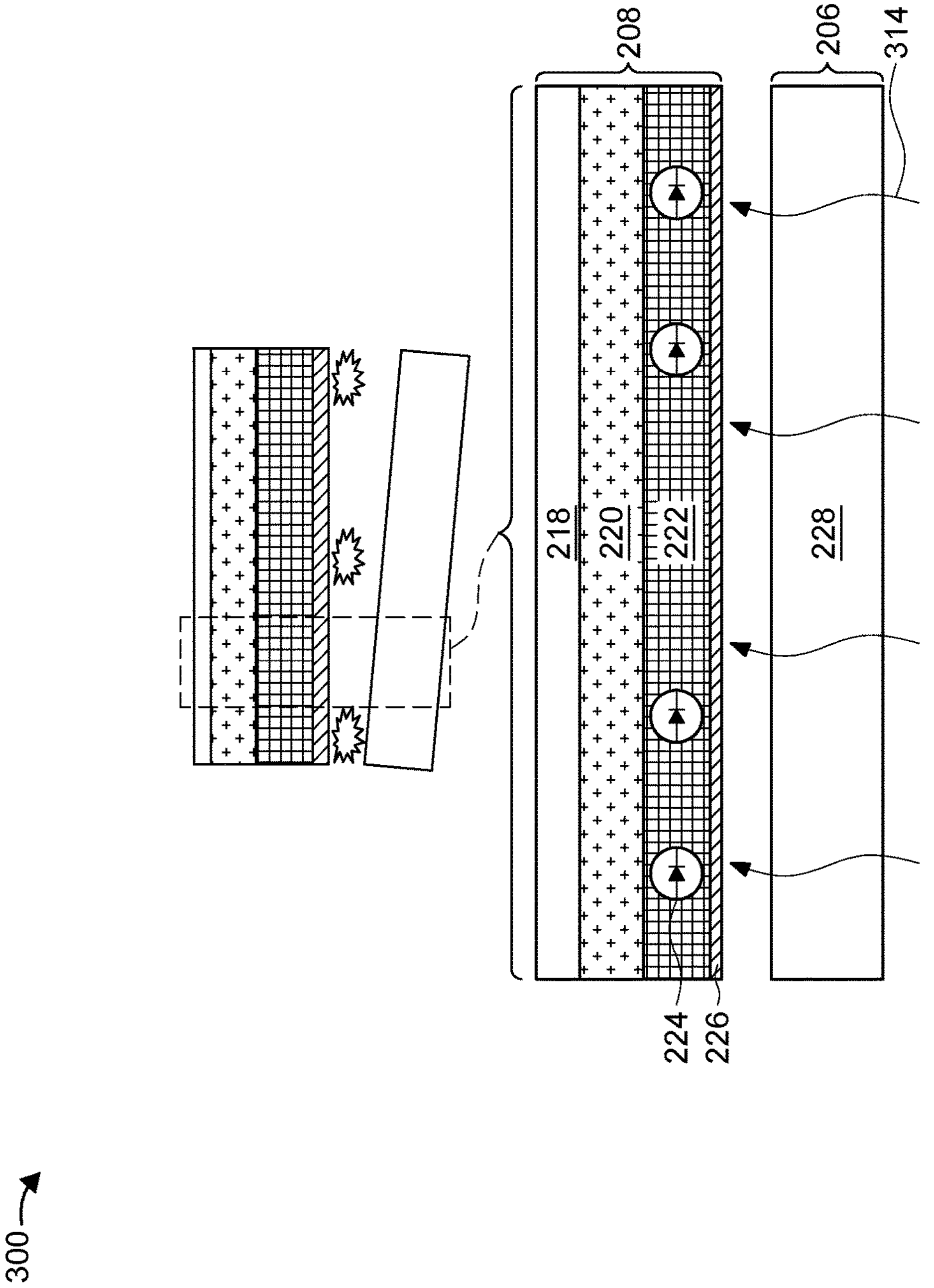

FIGS. 3A-3N are diagrams of an example series of operations 300 using the core layer 202 and the debonding layer 210 described herein. One or more of the series of operations 300 may be performed by one or more of the semiconductor processing tools 102-116 of FIG. 1. The diagrams include details that may be associated with a portion of the core layer 202 (e.g., an integrated circuit die formed over the core layer 202). Furthermore, several of the diagrams include a substrate (e.g., wafer) perspective 302, including layers that may be formed on sidewalls of the core layer 202.

The series of operations 300 may include using temporary carrier structures (e.g., semiconductor-on-insulator substrates) that are removed near, or upon, completion of an electronic device. Semiconductor devices formed using the series of operations 300 may include GaN-based materials formed on bulk semiconductor substrates comprising semiconductor material, such as silicon. In some implementations, semiconductor-on-insulator (SOI) substrates may be used as an alternative to bulk semiconductor substrates. SOI substrates have a thin layer of active semiconductor (e.g., silicon) separated from an underlying handle substrate by a layer of insulating material. The layer of insulating material electrically isolates the thin layer of active semiconductor from the handle substrate. In some implementations, the underlying handle substrate may be included as part of a temporary carrier structure used to form the semiconductor devices.

As shown in FIG. 3A, the core layer 202 is formed from a material having a bandgap lattice constant that is included in a range of approximately 6 eV to approximately 6.5 cV. For example, the core layer 202 may include an AlN material. In such a case, forming the core layer 202 may include a hydraulic compression tool (e.g., a hydraulic compression tool external to the environment 100 including the semiconductor processing tools 102-116) compressing an AlN powder. A furnace tool (e.g., a furnace tool external to the environment 100 including the semiconductor processing tools 102-116) may subsequently perform a sintering operation to the compressed AlN powder at an elevated temperature of approximately 2000° C. to form the core layer 202. However, other materials, values and ranges for a bandgap lattice constant of the material included in the core layer 202, and techniques of forming the core layer 202 are within the scope of the present disclosure.

The debonding layer 210 is formed over and/or on the core layer 202. The deposition tool 102 may deposit the debonding layer 210 in a sputtering operation (e.g., a PVD operation). Additionally, or alternatively, the deposition tool 102 may deposit the debonding layer 210 in an ALD operation, a CVD operation, an epitaxy operation, an oxidation operation, another type of deposition operation described in connection with FIG. 1, and/or another suitable deposition operation. In some implementations, the planarization tool 110 planarizes the debonding layer 210 after the deposition tool 102 deposits the debonding layer 210.

The debonding layer 210 may include a material having a bandgap lattice constant that is included in a range of approximately 1 eV to approximately 4 cV. For example, the debonding layer 210 may include a polysilicon material, an SiC material, or a GaN material. If the bandgap lattice constant of the material included in the debonding layer 210 is less than approximately 1 eV or greater than approximately 4 eV, the debonding layer 210 may not absorb energy (e.g., the energy 230) from a laser source passing through the core layer 202. However, other values and ranges for the bandgap lattice constant of a material included in the debonding layer 210 are within the scope of the present disclosure.

In some implementations, the debonding layer 210 includes a thickness D1 that is included in a range of approximately 0.1 microns to approximately 1.0 micron. If the thickness D1 is less than approximately 0.1 microns, the debonding layer 210 may not provide a sufficient temporary bond between the core layer 202 and another layer of a temporary carrier structure (e.g., another layer of the temporary carrier structure 204). If the thickness D1 is greater than approximately 1.0 micron, then thermally-induced stresses due to a mismatch of CTE's amongst the debonding layer 210 and other layers in a temporary carrier structure (e.g., the temporary carrier structure 204) may cause damage to the temporary carrier structure and/or a semiconductor device held by the temporary carrier structure (e.g., the semiconductor device 208). However, other values and ranges for the thickness D1 are included within the scope of the present disclosure.

As shown in FIG. 3B, the dielectric layer 212 is formed over and/or on the debonding layer 210. Additionally, or alternatively, the dielectric layer 212 is formed under and/or on the core layer 202. The deposition tool 102 may deposit the dielectric layer 212 in an LPCVD operation. Additionally, or alternatively, the deposition tool 102 may deposit the dielectric layer 212 in an ALD operation, a PVD operation, an epitaxy operation, an oxidation operation, another type of deposition operation described in connection with FIG. 1, and/or another suitable deposition operation. In some implementations, the planarization tool 110 planarizes the dielectric layer 212 after the deposition tool 102 deposits the dielectric layer 212. In some implementations, the dielectric layer 212 (e.g., an adhesion layer) includes an $SiO_2$ material. In some implementations, the dielectric layer 212 has a thickness that is included in a range of approximately 900 angstroms (Å) to approximately 1100 Å. However, other materials and thicknesses for the dielectric layer 212 are within the scope of the present disclosure.

As further shown in FIG. 3B, the dielectric layer 214 is formed over and/or on the dielectric layer 212. The deposition tool 102 may deposit the dielectric layer 214 in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the dielectric layer 214 after the deposition tool 102 deposits the dielectric layer 214. In some implementations, the dielectric layer 214 (e.g., a diffusion barrier) includes an SiN material. In some implementations, the dielectric layer 214 has a thickness that is included in a range of approximately 1800 angstroms (Å) to approximately 2200 Å. However, other materials, thickness values, and thickness ranges for the dielectric layer 214 are within the scope of the present disclosure.

In some implementations, the dielectric layer 212 and the dielectric layer 214 may encapsulate the core layer 202 to prevent migration of particulates from the core layer 202 (e.g., AlN particulates) into one or more chambers of the semiconductor processing tools 102-116. By preventing the migration of the particulates, yield losses to products fabricated using the semiconductor processing tools 102-116 may be decreased.

As shown in FIG. 3C, the dielectric layer 216 is formed over and/or on the dielectric layer 214 that is over the debonding layer 210. The deposition tool 102 may deposit the dielectric layer 216 in a PVD operation, an ALD operation, a CVD operation, an epitaxy operation, an oxidation operation, another type of deposition operation described in connection with FIG. 1, and/or another suitable deposition operation. In some implementations, the dielectric layer 216 includes an $SiO_2$ material. Additionally, or alternatively and in some implementations, the dielectric layer 216 includes a tetraethyl orthosilicate (TEOS) material. In some implementations, the planarization tool 110 planarizes the dielectric layer 216 (after the deposition tool 102 deposits the dielectric layer 216) to a thickness that is included in a range of approximately 1.36 microns to approximately 1.54 microns. However, other materials, thickness values, and thickness ranges for the dielectric layer 216 are within the scope of the present disclosure.

As shown in FIG. 3D, a layer stack 304 including the seed layer 218 and a semiconductor layer 306 may be bonded with the dielectric layer 216. For example, the bonding tool 116 may bond the seed layer 218 and the dielectric layer 216 using a eutectic bonding operation described in connection with FIG. 1, and/or another suitable bonding operation. In Some implementations, the seed layer 218 includes a layer of p(−) type of silicon material having a <111> orientation (e.g., Miller index), among other examples. In some implementations, the semiconductor layer 306 includes a layer of a p(+) type of silicon material having a <111> orientation, among other examples. In some implementations, the planarization tool 110 planarizes the semiconductor layer 306 (after the deposition tool bonding tool bonds the layer stack 304) such that the layer stack 304 includes a thickness that is included in a range of approximately 21 microns to approximately 25 microns. However, other materials, thickness values, and thickness ranges for the layer stack 304 are within the scope of the present disclosure.

As shown in FIG. 3E, the semiconductor layer 306 is removed from the seed layer 218. In some implementations, removing the semiconductor layer 306 includes the etch tool 108 performing an etch operation described in connection with FIG. 1, and/or another suitable etching operation. For example, the etch tool 108 may perform a wet etch operation that removes the semiconductor layer 306 (e.g., portions of the semiconductor layer 306 or all of the semiconductor layer 306) from the seed layer 218 using a hydrofluoric, nitric, acetic (HNA) etchant. Additionally, or alternatively, removing the semiconductor layer 306 from the seed layer 218 may include the planarization tool 110 performing a CMP operation as described in connection with FIG. 1, and/or another suitable planarization operation.

As shown in FIG. 3F, a dielectric layer 308 (e.g., a gate oxide) is formed over and/or on the seed layer 218. As an example, the deposition tool 102 may deposit the dielectric layer 308 in a LP-CVD operation. Additionally, or alternatively, the deposition tool may deposit the dielectric layer 308 in a PVD operation, an ALD operation, a CVD operation, an epitaxy operation, an oxidation operation, another type of deposition operation described in connection with FIG. 1, and/or another suitable deposition operation. In some implementations, the dielectric layer 308 includes an $SiO_2$ material. In some implementations, the dielectric layer 216 has a thickness that is included in a range of approximately 900 Å.

to approximately 1100 Å. However, other materials, thickness values, and thickness ranges for the dielectric layer 308 are within the scope of the present disclosure.

Furthermore, and as shown in FIG. 3F, a dielectric layer 310 and a dielectric layer 312 are formed over the core layer 202. Additionally, or alternatively, the dielectric layer 310 and the dielectric layer 312 are formed below the core layer 202. The deposition tool 102 may deposit the dielectric layer 310 and the dielectric layer 312 in a LP-CVD operation. Additionally, or alternatively, the deposition tool 102 may deposit the dielectric layer 310 and the dielectric layer 312 in a PVD operation, ALD operation, a CVD operation, an epitaxy operation, an oxidation operation, another type of deposition operation described in connection with FIG. 1, and/or another suitable deposition operation. In some implementations, the dielectric layer 310 includes a doped polysilicon material. In some implementations, the dielectric layer 312 includes an $SiO_2$ material. Furthermore, and in some implementations, the planarization tool 110 planarizes the dielectric layer 310 after deposition and/or the dielectric layer 312 after deposition. However, other materials for the dielectric layer 310 and the dielectric layer 312 are within the scope of the present disclosure.

As shown in FIG. 3G, portions of the dielectric layer 310 and the dielectric layer 312 that are over the core layer 202 (e.g., frontside portions) are removed. Furthermore, as shown in FIG. 3G, the dielectric layer 308 is removed. In some implementations, removing the portions of the dielectric layers 310 and 310 and the dielectric layer 308 includes the etch tool 108 performing an etch operation described in connection with FIG. 1, and/or another suitable etching operation. Additionally, or alternatively, removing the portions of the dielectric layers 310 and 310 and the dielectric layer 308 may include the planarization tool 110 performing a CMP operation as described in connection with FIG. 1, and/or another suitable planarization operation.

As shown in FIG. 3H, the substrate layer 220 is formed over and/or on the seed layer 218. The deposition tool 102 may deposit the substrate layer 220 in an epitaxy operation. Additionally, or alternatively, the deposition tool may deposit the substrate layer 220 in a PVD operation, an ALD operation, a CVD operation, an oxidation operation, another type of deposition operation described in connection with FIG. 1, and/or another suitable deposition operation. In some implementations, the substrate layer 220 includes a high bandgap material, such as a GaN material. In some implementations, the planarization tool 110 planarizes the substrate layer 220 after the deposition tool 102 deposits the substrate layer 220.

As shown in FIG. 3I, the series of operations 300 includes forming the HEMT layer 222 (including the integrated circuitry 224) over and/or on the substrate layer 220. In some implementations, the deposition tool 102 may deposit a combination of dielectric layers and conductive layers in a PVD operation, an ALD operation, a CVD operation, an oxidation operation, another type of deposition operation described in connection with FIG. 1, and/or another suitable deposition operation. Additionally, or alternatively and as part of forming the HEMT layer 222, one or more patterns in photoresist layers may be used to form the HEMT layer 222. In these implementations, the deposition tool 102 forms the photoresist layer on the layers of materials. The exposure tool 104 exposes the photoresist layer to a radiation source to pattern the photoresist layer. The developer tool 106 develops and removes portions of the photoresist layer to expose the patterns. The etch tool 108 etches the layers based on the patterns to form the HEMT layer 222 using a plasma-based operation, a wet chemical etch operation, and/or another type of etch operation. In some implementations, a photoresist removal tool removes the remaining portions of the photoresist layers (e.g., using a chemical stripper, plasma ashing, and/or another technique). In some implementations, a hard mask layers are used as alternative techniques for etching the HEMT layer 222. In some implementations, a photoresist removal tool removes the remaining portions of the photoresist layers (e.g., using a chemical stripper, plasma ashing, and/or another technique).

The HEMT layer 222 may include different types of the integrated circuitry 224. In some implementations, and as an example, the integrated circuitry 224 may be a type of integrated circuitry included in a power semiconductor device (e.g., transformer integrated circuitry, amplifier integrated circuitry, and/or voltage regulation integrated circuitry). In some implementations, and as another example, the integrated circuitry 224 may be a type of integrated circuitry included in an optoelectronic semiconductor device (e.g., photodiode integrated circuitry, LED integrated circuitry, and/or photosensor integrated circuitry).

In a case where the core layer 202 and the substrate layer 220 include a substantially similar CTE (e.g., a case where the core layer 202 includes a layer of an AlN material and where the substrate layer includes a layer GaN material), thermal stresses and/or strains induced to the HEMT layer 222 (including the integrated circuitry 224) through high temperature manufacturing operations (e.g., deposition operations) may be reduced. By reducing the thermal stresses and/or strains, a yield of a semiconductor device (e.g., the semiconductor device 208) including the HEMT layer 222 may be increased. In this way, an amount of resources to fabricate a volume of the semiconductor device including the HEMT layer 222 (manufacturing tools, raw materials, manpower, and/or computing resources, among other examples) may be decreased.

After removal of the core layer 202, the core layer 202 may be cleaned and/or reconditioned for reuse. For example, the planarization tool 110 may perform a polishing operation that removes remnants of the debonding layer 210 from the core layer 202. After cleaned and/or reconditioned for reuse, an additional iteration of layering over the core layer 202 (e.g., including additional debonding layers 210) may occur.

As shown in FIG. 3J, the protective layer 226 (e.g., a layer of a polyimide material) held by the temporary carrier structure 206 (e.g., a layer of a glass material) is joined with the HEMT layer 222. In such a case, the bonding tool 116 may bond the protective layer 226 and the HEMT layer 222 using a eutectic bonding operation described in connection with FIG. 1, and/or another suitable bonding operation.

As shown in FIG. 3K, layers held by the temporary carrier structure 204 and the temporary carrier structure 206 are inverted. Also, as shown in FIG. 3K, one or more operations remove the dielectric layer 212, the dielectric layer 214, the dielectric layer 308, and the dielectric layer 310 from the core layer 202. The one or more operations may include, for example, the etch tool 108 performing an etch operation, including a plasma etch operation, a wet chemical etch operation, and/or another type of etch operation described in connection with FIG. 1. The one or more operations may further include the planarization tool 110 performing a CMP operation as described in connection with FIG. 1, and/or another suitable planarization operation.

As shown in FIG. 3L, the core layer 202 is removed from the temporary carrier structure 204. For example, and to remove the core layer 202 from the temporary carrier structure 204, the laser tool 114 may provide the energy 230 to the debonding layer 210. In some implementations, the laser tool 114 provides the energy 230 as an electromagnetic wave, where the electromagnetic wave has a wavelength that is included in a range of approximately 180 nanometers to approximately 260 nanometers. In some implementations, and based on the bandgap lattice constant of the debonding layer 210 (e.g., a bandgap lattice constant that is included in a range of approximately 1.0 eV to approximately 4.0 eV) being lesser relative to the bandgap lattice constant of the core layer 202 (e.g., a band gap lattice constant that is included in a range of approximately 6.0 eV to approximately 6.5 eV), the energy 230 may pass through the core layer 202 and be absorbed by the debonding layer 210.

By using the laser removal process shown in FIG. 3L, a likelihood of damage to the core layer 202 may be reduced, thereby allowing the core layer 202 to be recovered for reuse. Additionally, or alternatively, a likelihood of damage to the semiconductor device 208 may be reduced, thereby improving a yield of manufacturing the semiconductor device 208. In this way, an amount of resources to fabricate a volume of the semiconductor device 208 (manufacturing tools, raw materials, manpower, and/or computing resources, among other examples) may be decreased.

As shown in FIG. 3M, the series of operations 300 may include removing remnants of the debonding layer 210, the dielectric layer 212, the dielectric layer 214, and the dielectric layer 216 from above the seed layer 218. In some implementations, removing the remnants of the debonding layer 210 and/or the dielectric layers 212-216 include the etch tool 108 performing an etch operation, including a plasma etch operation, a wet chemical etch operation, and/or another type of etch operation described in connection with FIG. 1, and/or another suitable etching operation. Additionally, or alternatively, removing the remnants of the debonding layer 210 and/or the dielectric layers 212-216 may include the planarization tool 110 performing a CMP operation as described in connection with FIG. 1, and/or another suitable planarization operation. Further, and as shown in FIG. 3M, the temporary carrier structure 206 carries the semiconductor device 208 (e.g., the protective layer 226, the seed layer 218, the substrate layer 220, the HEMT layer 222 including the integrated circuitry 224) on the core layer 228.

As shown in FIG. 3N, the semiconductor device 208 and the core layer 228 are separated. Separating the semiconductor device 208 and the core layer 228 may include, for example, the laser tool 114 providing energy 314 to the protective layer 226. In some implementations, the laser tool 114 provides the energy 314 as an electromagnetic wave, where the electromagnetic wave has a wavelength that is included in a range of approximately 300 nanometers to approximately 360 nanometers. However, other values and ranges of the wavelength of the energy 314 are within the scope of the present disclosure.

Although FIGS. 3A-3N shows an example series of operations 300 using the core layer 202 and the debonding layer 210, using the core layer 202 and/or the debonding layer 210 may include fewer operations, different operations, or differently arranged operations than those depicted in FIGS. 3A-3N. Further, one or more of the series of operations 300 using the core layer 202 and the debonding layer 210 may be applicable to a "dual-sided" process performed on the core layer 202 (e.g., the core layer 202 may be in a round, wafer form that is subjected to dual-sided processing). Additionally, one or more of the series of operations 300 may be applicable to a "single-sided" process (e.g., the core layer 202 may be included in a rectangular, die form that is subjected to single-sided processing).

Figure 4:
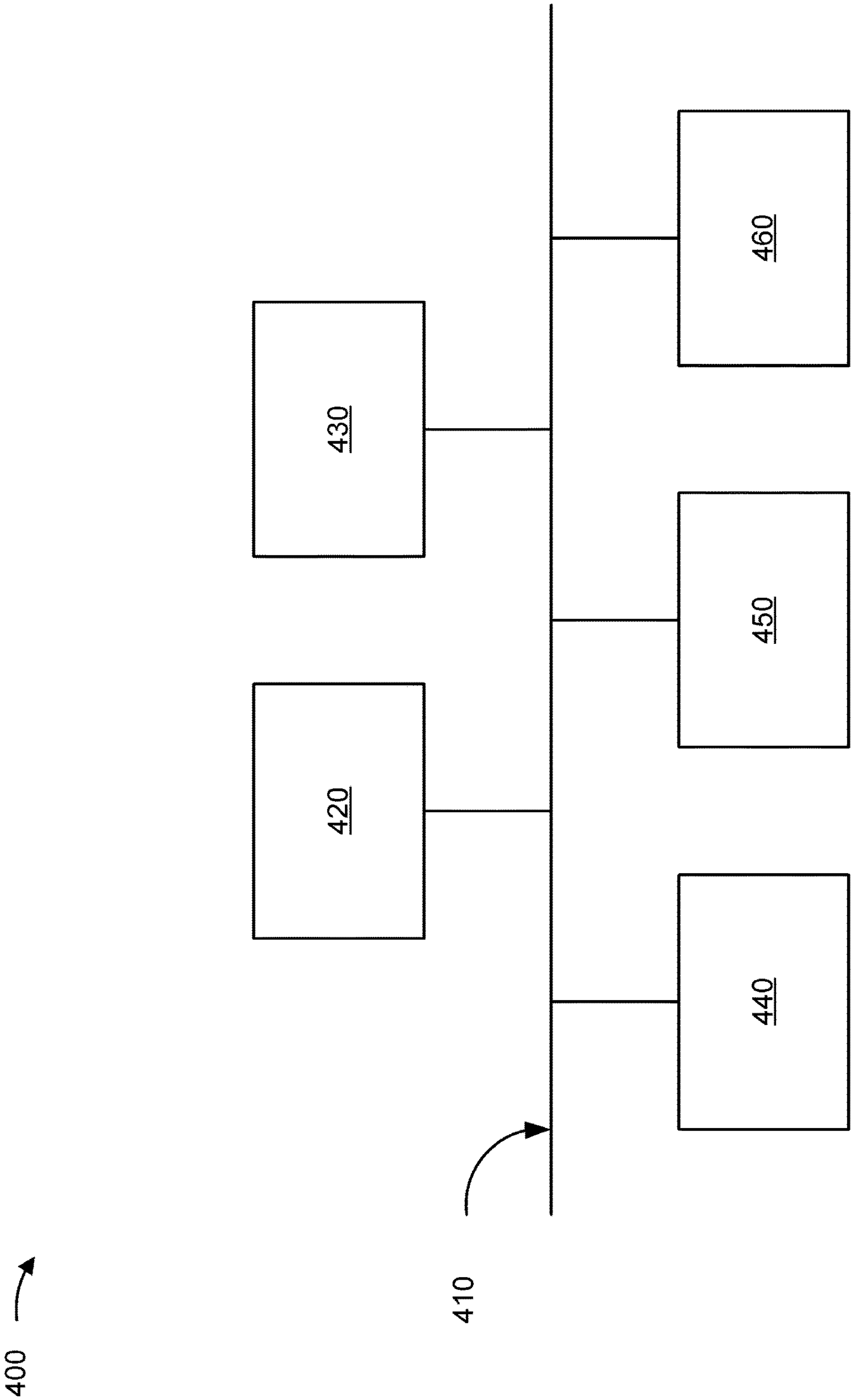
FIG. 4 is a diagram of example components of one or more devices of FIG. 1 described herein.

FIG. 4 is a diagram of example components of a device 400. In some implementations, one or more of the semiconductor processing tools and/or the wafer/die transport tool 118 may include one or more devices 400 and/or one or more components of the device 400. As shown in FIG. 4, the device 400 may include a bus 410, a processor 420, a memory 430, an input component 440, an output component 450, and/or a communication component 460.

The bus 410 may include one or more components that enable wired and/or wireless communication among the components of the device 400. The bus 410 may couple together two or more components of FIG. 4, such as via operative coupling, communicative coupling, electronic coupling, and/or electric coupling. For example, the bus 410 may include an electrical connection (e.g., a wire, a trace, and/or a lead) and/or a wireless bus. The processor 420 may include a central processing unit, a graphics processing unit, a microprocessor, a controller, a microcontroller, a digital signal processor, a field-programmable gate array, an application-specific integrated circuit, and/or another type of processing component. The processor 420 may be implemented in hardware, firmware, or a combination of hardware and software. In some implementations, the processor 420 may include one or more processors capable of being programmed to perform one or more operations or processes described elsewhere herein.

The memory 430 may include volatile and/or nonvolatile memory. For example, the memory 430 may include random access memory (RAM), read only memory (ROM), a hard disk drive, and/or another type of memory (e.g., a flash memory, a magnetic memory, and/or an optical memory). The memory 430 may include internal memory (e.g., RAM, ROM, or a hard disk drive) and/or removable memory (e.g., removable via a universal serial bus connection). The memory 430 may be a non-transitory computer-readable medium. The memory 430 may store information, one or more instructions, and/or software (e.g., one or more software applications) related to the operation of the device 400. In some implementations, the memory 430 may include one or more memories that are coupled (e.g., communicatively coupled) to one or more processors (e.g., processor 420), such as via the bus 410. Communicative coupling between a processor 420 and a memory 430 may enable the processor 420 to read and/or process information stored in the memory 430 and/or to store information in the memory 430.

The input component 440 may enable the device 400 to receive input, such as user input and/or sensed input. For example, the input component 440 may include a touch screen, a keyboard, a keypad, a mouse, a button, a microphone, a switch, a sensor, a global positioning system sensor, an accelerometer, a gyroscope, and/or an actuator. The output component 450 may enable the device 400 to provide output, such as via a display, a speaker, and/or a light-emitting diode. The communication component 460 may enable the device 400 to communicate with other devices via a wired connection and/or a wireless connection. For example, the communication component 460 may include a receiver, a transmitter, a transceiver, a modem, a network interface card, and/or an antenna.

The device 400 may perform one or more operations or processes described herein. For example, a non-transitory computer-readable medium (e.g., memory 430) may store a set of instructions (e.g., one or more instructions or code) for execution by the processor 420. The processor 420 may execute the set of instructions to perform one or more operations or processes described herein. In some implementations, execution of the set of instructions, by one or more processors 420, causes the one or more processors 420 and/or the device 400 to perform one or more operations or processes described herein. In some implementations, hardwired circuitry may be used instead of or in combination with the instructions to perform one or more operations or processes described herein. Additionally, or alternatively, the processor 420 may be configured to perform one or more operations or processes described herein. Thus, implementations described herein are not limited to any specific combination of hardware circuitry and software.

The number and arrangement of components shown in FIG. 4 are provided as an example. The device 400 may include additional components, fewer components, different components, or differently arranged components than those shown in FIG. 4. Additionally, or alternatively, a set of components (e.g., one or more components) of the device 400 may perform one or more functions described as being performed by another set of components of the device 400.

Figure 5:
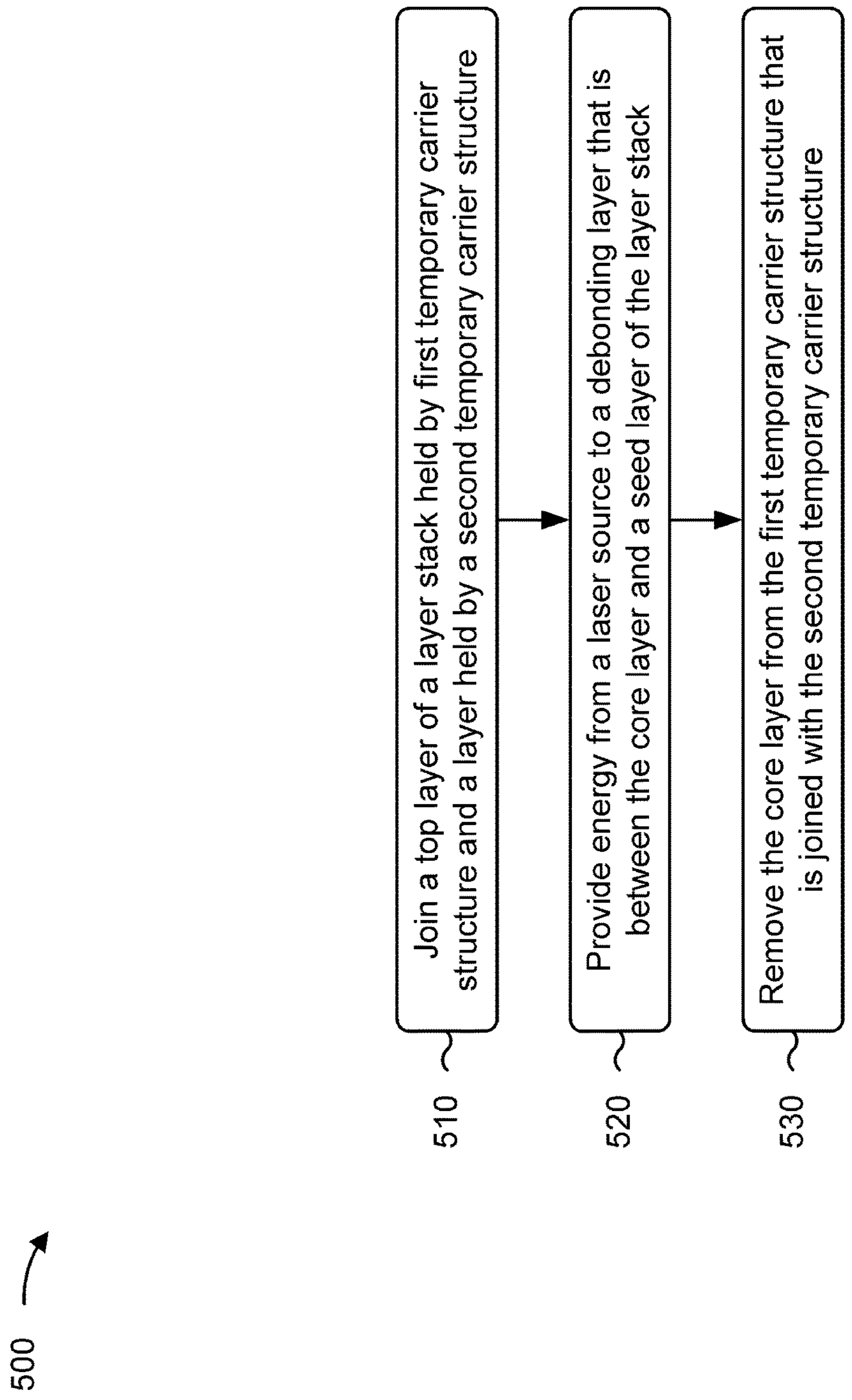
FIGS. 5-7 are flowcharts of example processes associated with a reusable temporary carrier structure core described herein.

FIG. 5 is a flowchart of an example process 500 associated with a reusable temporary carrier structure core. In some implementations, one or more process blocks of FIG. 5 are performed by one or more of semiconductor processing tools (e.g., one or more of the semiconductor processing tools 102-116). Additionally, or alternatively, one or more process blocks of FIG. 5 may be performed by one or more components of device 400, such as processor 420, memory 430, input component 440, output component 450, and/or communication component 460.

As shown in FIG. 5, process 500 may include joining a top layer of a layer stack held by first temporary carrier structure and a layer held by a second temporary carrier structure (block 510). For example, one or more of the semiconductor processing tools 102-116 may join a top layer (e.g., the HEMT layer 222) of a layer stack held by first temporary carrier structure (e.g., the temporary carrier structure 204) and a layer (e.g., the protective layer 226) held by a second temporary carrier structure (e.g., the temporary carrier structure 206), as described herein. In some implementations, a core layer (e.g., the core layer 202) of the first temporary carrier structure comprises a metal compound (e.g., an AlN compound).

As further shown in FIG. 5, process 500 may include providing energy from a laser source to a debonding layer that is between the core layer and a seed layer of the layer stack (block 520). For example, one or more of the semiconductor processing tools 102-116 may provide energy (e.g., the energy 230) from a laser source (e.g., the laser tool 114) to a debonding layer (e.g., the debonding layer 210) that is between the core layer and a seed layer (e.g., the seed layer 218) of the layer stack, as described herein.

As further shown in FIG. 5, process 500 may include removing the core layer from the first temporary carrier structure that is joined with the second temporary carrier structure (block 530). For example, one or more of the semiconductor processing tools 102-116 may remove the core layer from the first temporary carrier structure that is joined with the second temporary carrier structure, as described herein.

Process 500 may include additional implementations, such as any single implementation or any combination of implementations described below and/or in connection with one or more other processes described elsewhere herein.

In a first implementation, the debonding layer includes a material having a bandgap lattice constant that is lesser relative to a bandgap lattice constant of the metal compound, and providing the energy from the laser source to the debonding layer includes providing the energy to the material having the bandgap lattice constant that is lesser relative to the bandgap lattice constant of the metal compound.

In a second implementation, alone or in combination with the first implementation, the metal compound includes an aluminum nitride material, and providing the energy from the laser source to the debonding layer includes providing the energy to a location between the core layer and a layer of a gallium nitride material that is on the seed layer.

In a third implementation, alone or in combination with one or more of the first and second implementations, providing the energy from the laser source to the debonding layer includes providing an electromagnetic wave having a wavelength that is included in a range of approximately 180 nanometers to approximately 260 nanometers.

In a fourth implementation, alone or in combination with one or more of the first through third implementations, the core layer is a first core layer and the second temporary carrier structure includes a second core layer (e.g., the core layer 228) including a layer of a glass material.

Figure 6:
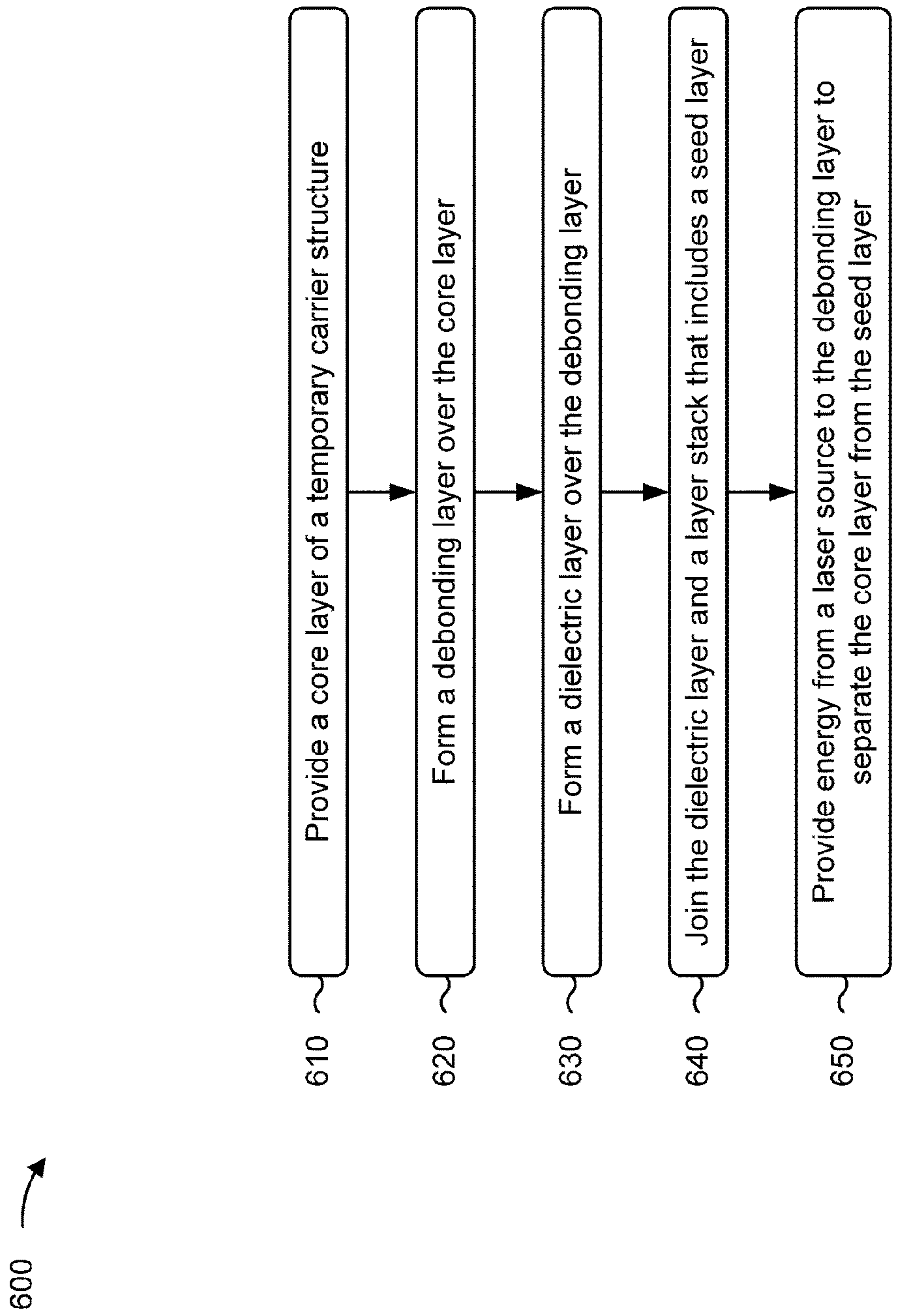

FIG. 6 is a flowchart of an example process 600 associated with a reusable temporary carrier structure core. In some implementations, one or more process blocks of FIG. 6 are performed by one or more of semiconductor processing tools (e.g., one or more of the semiconductor processing tools 102-116). Additionally, or alternatively, one or more process blocks of FIG. 6 may be performed by one or more components of device 400, such as processor 420, memory 430, input component 440, output component 450, and/or communication component 460.

As shown in FIG. 6, process 600 may include providing a core layer of a temporary carrier structure (block 610). For example, one or more of the semiconductor processing tools 102-116 may provide a core layer (e.g., the core layer 202) of a temporary carrier structure (e.g., the temporary carrier structure 204), as described herein. In some implementations, the core layer includes a metal compound having a first bandgap lattice constant.

As further shown in FIG. 6, process 600 may include forming a debonding layer over the core layer (block 620). For example, one or more of the semiconductor processing tools 102-116 may form a debonding layer (e.g., the debonding layer 210) over the core layer, as described herein. In some implementations, the debonding layer includes a material having a second bandgap lattice constant that is lesser than the first bandgap lattice constant.

As further shown in FIG. 6, process 600 may include forming a dielectric layer over the debonding layer (block 630). For example, one or more of the semiconductor processing tools 102-116 may form a dielectric layer (e.g., the dielectric layer 216) over the debonding layer, as described herein.

As further shown in FIG. 6, process 600 may include joining the dielectric layer and a layer stack that includes a seed layer (block 640). For example, one or more of the semiconductor processing tools 102-116 may join the dielectric layer and a layer stack that includes a seed layer (e.g., the seed layer 218), as described herein.

As further shown in FIG. 6, process 600 may include providing energy from a laser source to the debonding layer to separate the core layer from the seed layer (block 650). For example, one or more of the semiconductor processing tools 102-116 (e.g., the laser tool 114) may provide energy (e.g., the energy 230) from a laser source to the debonding layer to separate the core layer from the seed layer, as described herein.

Process 600 may include additional implementations, such as any single implementation or any combination of implementations described below and/or in connection with one or more other processes described elsewhere herein.

In a first implementation, forming the debonding layer comprises forming a layer of a polysilicon material, forming a layer of a silicon carbide material, or forming a layer of a gallium nitride material.

In a second implementation, alone or in combination with the first implementation, joining the dielectric layer, that is over the debonding layer, and the layer stack that includes the seed layer includes joining the dielectric layer, that is over the debonding layer, and a layer of a p(−) type of silicon material above the seed layer.

In a third implementation, alone or in combination with one or more of the first and second implementations, process 600 includes forming a high electron mobility transistor layer (e.g., the HEMT layer 222) over the debonding layer prior to providing the energy from the laser source to the debonding layer.

In a fourth implementation, alone or in combination with one or more of the first through third implementations, the debonding layer is a first debonding layer and further including thinning the core layer after providing the laser source to the debonding layer to separate the core layer from the temporary carrier structure.

Thereafter, a second debonding layer may be formed over the core layer 202, so that the previous processes can be performed for another semiconductor device 208 by re-using the same core layer 202. The second debonding layer formed over the core layer 202 are shown as the debonding layer 210 over the core layer 202 in FIG. 3A. Therefore, the manufacturing cost is reduced.

In a fifth implementation, alone or in combination with one or more of the first through fourth implementations, process 600 includes forming a substrate layer (e.g., the substrate layer 220) over the debonding layer and on the seed layer prior to providing the energy from the laser source to the debonding layer.

In a sixth implementation, alone or in combination with one or more of the first through fifth implementations, forming the substrate layer includes forming the substrate layer from a material comprising a coefficient of thermal expansion that is approximately equal to a coefficient of thermal expansion of a material of the core layer.

In a seventh implementation, alone or in combination with one or more of the first through sixth implementations, forming the substrate layer includes forming the substrate layer using an epitaxial growth operation that forms a layer of a gallium nitride material as part of the substrate layer.

Although FIG. 6 shows example blocks of process 600, in some implementations, process 600 includes additional blocks, fewer blocks, different blocks, or differently arranged blocks than those depicted in FIG. 6. Additionally, or alternatively, two or more of the blocks of process 600 may be performed in parallel.

Figure 7:
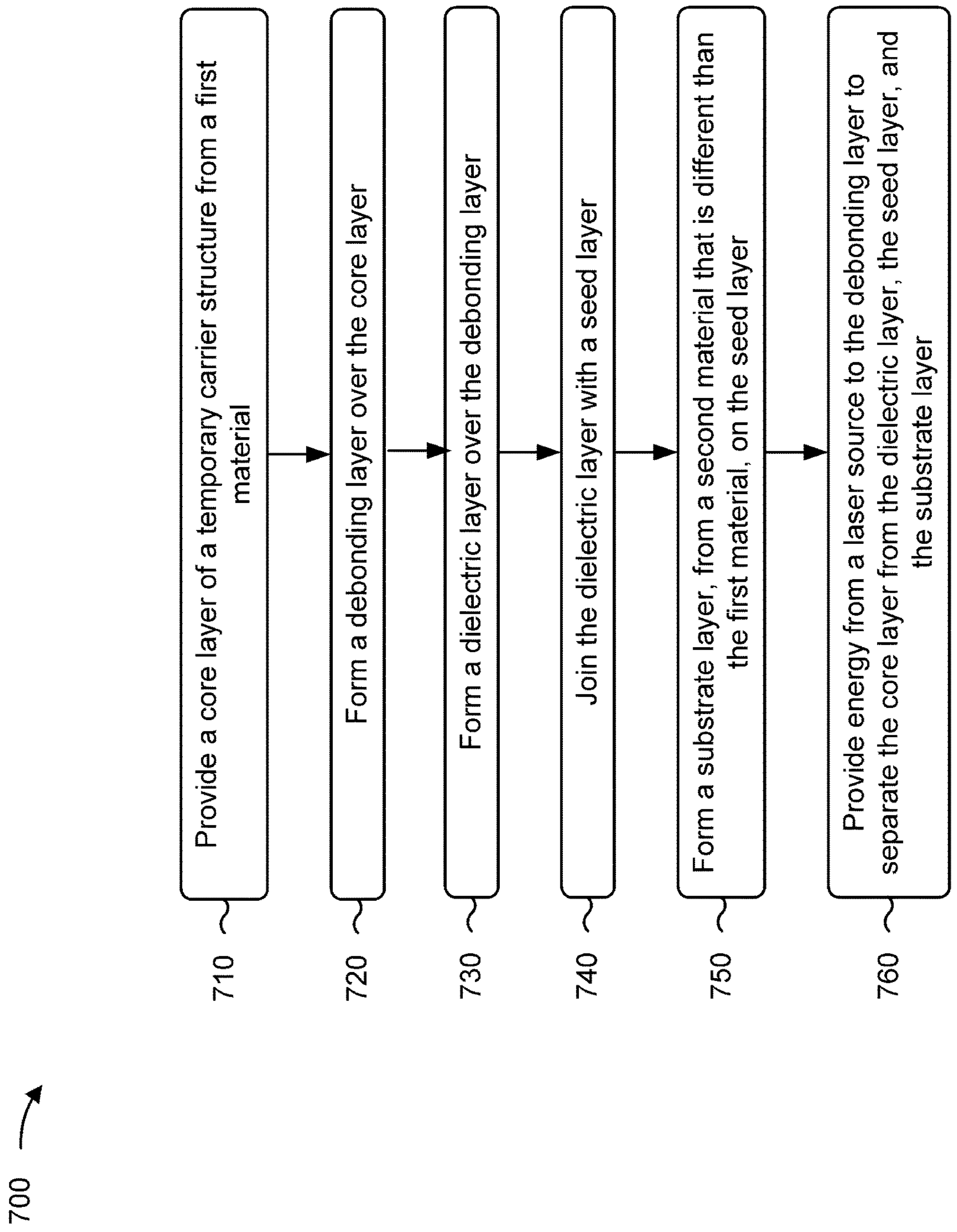

FIG. 7 is a flowchart of an example process 700 associated with a reusable temporary carrier structure core. In some implementations, one or more process blocks of FIG. 7 are performed by one or more of semiconductor processing tools (e.g., one or more of the semiconductor processing tools 102-116). Additionally, or alternatively, one or more process blocks of FIG. 7 may be performed by one or more components of device 400, such as processor 420, memory 430, input component 440, output component 450, and/or communication component 460.

As shown in FIG. 7, process 700 may include providing a core layer of a temporary carrier structure from a first material (block 710). For example, one or more of the semiconductor processing tools 102-116 may provide a core layer (e.g., the core layer 202) of a temporary carrier structure (e.g., the temporary carrier structure 204) from a first material, as described herein. In some implementations, the first material (e.g., an AlN material) includes a first coefficient of thermal expansion for a temperature range related to growth of an epitaxial material (e.g., a GaN epitaxial material).

As further shown in FIG. 7, process 700 may include forming a debonding layer over the core layer (block 720). For example, one or more of the semiconductor processing tools 102-116 may form a debonding layer (e.g., the debonding layer 210) over the core layer, as described herein.

As further shown in FIG. 7, process 700 may include forming a dielectric layer over the debonding layer (block 730). For example, one or more of the semiconductor processing tools 102-116 may form a dielectric layer (e.g., the dielectric layer 216) over the debonding layer, as described herein.

As further shown in FIG. 7, process 700 may include joining the dielectric layer with a seed layer (block 740). For example, one or more of the semiconductor processing tools 102-116 may join the dielectric layer with a seed layer (e.g., the seed layer 218), as described herein.

As further shown in FIG. 7, process 700 may include forming a substrate layer, from a second material that is different than the first material, on the seed layer (block 750). For example, one or more of the semiconductor processing tools 102-116 may form a substrate layer (.g., the substrate layer 220), from a second material (e.g., a GaN material) that is different than the first material, on the seed layer, as described herein. In some implementations, the second material includes a second coefficient of thermal expansion for the temperature range related to the growth of the epitaxial material. In some implementations, a ratio of the second coefficient of thermal expansion to the first coefficient of thermal expansion is approximately 1:1.

As further shown in FIG. 7, process 700 may include providing energy from a laser source to the debonding layer to separate the core layer from the dielectric layer, the seed layer, and the substrate layer (block 760). For example, one or more of the semiconductor processing tools 102-116 may provide energy (e.g., the energy 230) from a laser source to the debonding layer to separate the core layer from the dielectric layer, the seed layer, and the substrate layer, as described herein.

Process 700 may include additional implementations, such as any single implementation or any combination of implementations described below and/or in connection with one or more other processes described elsewhere herein.

In a first implementation, forming the debonding layer includes forming the debonding layer from a material having a bandgap lattice constant that is included in a range of approximately 1 electron volt to approximately 4 electron volts.

In a second implementation, alone or in combination with the first implementation, forming the debonding layer includes forming the debonding layer to a thickness (e.g., the thickness D1) that is included in a range of approximately 0.1 microns to approximately 1.0 micron.

In a third implementation, alone or in combination with one or more of the first and second implementations, forming the substrate layer includes forming the substrate layer from a material having a bandgap lattice constant that is included in a range of approximately 3.25 electron volts to approximately 3.75 electron volts.

In a fourth implementation, alone or in combination with one or more of the first through third implementations, process 700 includes forming a high electron mobility transistor layer (e.g., the HEMT layer 222) on the substrate layer and over the debonding layer.

In a fifth implementation, alone or in combination with one or more of the first through fourth implementations, the temporary carrier structure corresponds to a first temporary carrier structure and the method further includes joining a polyimide layer (e.g., the protective layer 226) carried by a second temporary carrier structure (e.g., the temporary carrier structure 206) to the high electron mobility transistor layer prior to providing the energy from the laser source to the debonding layer.

In a sixth implementation, alone or in combination with one or more of the first through fifth implementations, providing the energy from the laser source to the debonding layer separates a semiconductor device (e.g., the semiconductor device 208) including the seed layer, the substrate layer, the high electron mobility transistor layer, and the polyimide layer from the core layer.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

Some implementations described herein provide a temporary carrier structure and techniques to form a semiconductor device on the temporary carrier structure. The temporary carrier structure includes a core layer formed from a material having a first bandgap lattice constant. The temporary carrier structure further includes a debonding layer formed from another material having a second bandgap energy constant that is lesser relative to the first bandgap lattice constant. Techniques to form the semiconductor device include forming substrate layer of the semiconductor device on the temporary carrier structure, where a material of the substrate layer and the material of the core layer have a same approximate CTE. The techniques further include providing energy (e.g., electromagnetic waves from a laser source) to the debonding layer to remove the core layer from the temporary carrier structure.

Due to the difference in bandgap lattice constants between the material of the core layer and the material of the debonding layer, the energy may be of a wavelength that penetrate the core layer and is absorbed by the debonding layer. Such a wavelength may reduce damage to the core layer and/or the substrate layer to reduce manufacturing costs (e.g., the core layer may be recovered for reuse and a yield of a semiconductor device formed on the substrate layer may increase).

Further, and due to the same approximate CTE of the material of the core layer and the material of the substrate layer, manufacturing defects in the semiconductor device due to thermal strains and/or stresses during formation of the semiconductor device may be minimized. For example, and for semiconductor devices manufactured in a form of a wafer having a thickness that is greater than approximately 6 microns and a diameter greater than approximately 150 millimeters, manufacturing defects such as cracking and/or dislocation issues within the silicon material may be minimized. As another example, and for semiconductor devices manufactured in a form of a wafer having a diameter of greater than approximately 200 millimeters, manufacturing defects such as wafer bow and/or warpage that cause non-uniformities in epitaxial growth of the GaN material may be minimized.

In this way, a manufacturing yield of the semiconductor device may increase relative to another semiconductor device fabricated using another temporary carrier structure not including the debonding layer and/or the core layer. Additionally, or alternatively, a recovery rate of the core layer may increase relative to another recovery rate for another core layer from another temporary carrier structure not including the debonding layer. By increasing the manufacturing yield of the semiconductor device and increasing the recovery rate of the core layer, an amount of resources to fabricate a volume of the semiconductor device (manufacturing tools, raw materials, manpower, and/or computing resources, among other examples) may be decreased.

As described in greater detail above, some implementations described herein provide a method. The method includes joining a first temporary carrier structure and a second temporary carrier structure. The method includes providing energy from a laser source to a debonding layer that is between a core layer of the first temporary carrier structure and a seed layer held by the first temporary carrier structure. The method includes removing the core layer from the first temporary carrier structure that is joined with the second temporary carrier structure.

As described in greater detail above, some implementations described herein provide a method. The method includes forming a core layer of a temporary carrier structure, where the core layer includes a first bandgap lattice constant. The method includes forming a debonding layer over the core layer, where the debonding layer includes a second bandgap lattice constant that is lesser relative to the first bandgap lattice constant. The method includes forming a dielectric layer over the debonding layer. The method includes joining the dielectric layer and a seed layer. The method includes providing energy from a laser source to the debonding layer to separate the core layer from the temporary carrier structure, where the temporary carrier structure includes the seed layer.

As described in greater detail above, some implementations described herein provide a method. The method includes forming a core layer of a temporary carrier structure from a first material, where the first material includes a first coefficient of thermal expansion. The method includes forming a debonding layer over the core layer. The method includes forming a dielectric layer over the debonding layer. The method includes forming a substrate layer, from a second material that is different than the first material, onto a seed layer that is joined to the dielectric layer, where the second material includes a second coefficient of thermal expansion that is approximately equal to the first coefficient of thermal expansion. The method includes providing energy from a laser source to the debonding layer to separate the core layer from the dielectric layer, the seed layer that is joined to the dielectric layer, and the substrate layer that is formed onto the seed layer.

As used herein, the term "and/or," when used in connection with a plurality of items, is intended to cover each of the plurality of items alone and any and all combinations of the plurality of items. For example, "A and/or B" covers "A and B," "A and not B," and "B and not A."

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

joining a top layer of a layer stack held by a first temporary carrier structure and a layer held by a second temporary carrier structure, wherein the first temporary carrier structure comprises a core layer that consists of aluminum nitride having a bandgap between approximately 6.0 electron volts (eV) and approximately 6.28 eV;

providing energy from a laser source to a debonding layer that is between the core layer and a seed layer of the layer stack; and removing the core layer from the first temporary carrier structure that is joined with the second temporary carrier structure.

2. The method of claim 1, wherein the debonding layer includes a material having a bandgap that is less than the bandgap of the aluminum nitride, and wherein providing the energy from the laser source to the debonding layer comprises:

providing the energy to the material having the bandgap that is lesser relative to the bandgap of the aluminum nitride.

3. The method of claim 1, wherein providing the energy from the laser source to the debonding layer comprises:

providing the energy to a location between the core layer and a layer of a gallium nitride material that is on the seed layer.

4. The method of claim 1, wherein providing the energy from the laser source to the debonding layer comprises:

providing an electromagnetic wave having a wavelength that is included in a range of approximately 180 nanometers to approximately 260 nanometers.

5. The method of claim 1, wherein the core layer is a first core layer and the second temporary carrier structure comprises:

a second core layer comprising a layer of a glass material.

6. A method, comprising:

providing a core layer of a temporary carrier structure, wherein the core layer consists of aluminum nitride having a first bandgap of less than approximately 6.28 electron volts (eV);

forming a debonding layer over the core layer, wherein the debonding layer comprises a first material having a second bandgap less than the first bandgap;

forming a dielectric layer over the debonding layer;

joining the dielectric layer and a layer stack that includes a seed layer; and providing energy from a laser source to the debonding layer to separate the core layer from the seed layer.

7. The method of claim 6, wherein forming the debonding layer comprises:

forming a layer of a polysilicon material, forming a layer of a silicon carbide material, or forming a layer of a gallium nitride material.

8. The method of claim 6, wherein the layer stack further includes a layer of a p(−) type of silicon material above the seed layer.

9. The method of claim 6, further comprising:

forming a high electron mobility transistor layer over the debonding layer prior to providing the energy from the laser source to the debonding layer.

10. The method of claim 6, wherein the debonding layer is a first debonding layer, the method further comprising:

thinning the core layer after providing energy from the laser source to the debonding layer to separate the core layer from the temporary carrier structure, and forming a second debonding layer over the core layer.

11. The method of claim 6, further comprising:

forming a substrate layer over the debonding layer and on the seed layer prior to providing the energy from the laser source to the debonding layer.

12. The method of claim 11, wherein forming the substrate layer comprises:

forming the substrate layer from a second material comprising a coefficient of thermal expansion that is approximately equal to a coefficient of thermal expansion of the aluminum nitride.

13. The method of claim 11, wherein forming the substrate layer comprises:

forming the substrate layer using an epitaxial growth operation that forms a layer of a gallium nitride material as part of the substrate layer.

14. A method, comprising:

providing a core layer, of a temporary carrier structure, aluminum nitride having a first bandgap of less than approximately 6.28 electron volts (eV), wherein the aluminum nitride comprises a first coefficient of thermal expansion for a temperature range related to a growth of an epitaxial material;

forming a debonding layer over the core layer;

forming a dielectric layer over the debonding layer;

joining the dielectric layer with a seed layer;

forming a substrate layer, from a second material that is different from the aluminum nitride, on the seed layer, wherein the second material comprises a second coefficient of thermal expansion for the temperature range related to the growth of the epitaxial material, and wherein a ratio of the second coefficient of thermal expansion to the first coefficient of thermal expansion is approximately 1:1; and providing energy from a laser source to the debonding layer to separate the core layer from the dielectric layer, the seed layer, and the substrate layer.

15. The method of claim 14, wherein forming the debonding layer comprises:

forming the debonding layer from a third material having a second bandgap that is included in a range of approximately 1 eV to approximately 4 eV.

16. The method of claim 14, wherein forming the debonding layer comprises:

forming the debonding layer to a thickness that is included in a range of approximately 0.1 microns to approximately 1.0 micron.

17. The method of claim 14, wherein forming the substrate layer comprises:

forming the substrate layer from a third material having a second bandgap that is included in a range of approximately 3.25 eV to approximately 3.75 eV.

18. The method of claim 14, further comprising: forming a high electron mobility transistor layer on the substrate layer and over the debonding layer.

19. The method of claim 18, wherein the temporary carrier structure corresponds to a first temporary carrier structure and the method further comprises:

joining a polyimide layer carried by a second temporary carrier structure to the high electron mobility transistor layer prior to providing the energy from the laser source to the debonding layer.

20. The method of claim 19, wherein providing the energy from the laser source to the debonding layer separates a semiconductor device comprising the seed layer, the substrate layer, the high electron mobility transistor layer, and the polyimide layer from the core layer.

* * * * *